(12) United States Patent
Amemiya et al.

(10) Patent No.: US 8,849,630 B2
(45) Date of Patent: Sep. 30, 2014

(54) TECHNIQUES TO PREDICT THREE-DIMENSIONAL THERMAL DISTRIBUTIONS IN REAL-TIME

(75) Inventors: Yasuo Amemiya, Hartsdale, NY (US); Hendrik F. Hamann, Yorktown Heights, NY (US); Walter Hirt, Wettswil (CH); Ying Hung, Atlanta, GA (US); Jing Shen, Athens, GA (US)

(73) Assignee: International Business Machines Corporation, Armonk, NY (US)

( * ) Notice: Subject to any disclaimer, the term of this patent is extended or adjusted under 35 U.S.C. 154(b) by 1453 days.

(21) Appl. No.: 12/146,952

(22) Filed: Jun. 26, 2008

(65) Prior Publication Data

US 2009/0326884 A1    Dec. 31, 2009

(51) Int. Cl.
*G06G 7/48* (2006.01)
*G06G 7/56* (2006.01)
*G06G 7/50* (2006.01)
*G06F 17/50* (2006.01)
*G06F 1/20* (2006.01)
*H05K 7/20* (2006.01)

(52) U.S. Cl.
CPC ............ *G06F 1/206* (2013.01); *G06F 17/5009* (2013.01); *H05K 7/20836* (2013.01)
USPC ...................... 703/5; 703/9; 703/14

(58) Field of Classification Search
CPC ............................ G06F 1/206; G06F 17/5009
USPC .................................................. 703/5, 9, 14
See application file for complete search history.

(56) References Cited

U.S. PATENT DOCUMENTS

| | | | |
|---|---|---|---|
| 6,718,277 B2 | 4/2004 | Sharma | |
| 7,308,385 B2 * | 12/2007 | Wegerich et al. | 702/183 |
| 7,366,632 B2 * | 4/2008 | Hamann et al. | 702/130 |
| 7,444,190 B2 | 10/2008 | Pflugl et al. | |
| 7,644,051 B1 * | 1/2010 | Moore et al. | 706/21 |
| 7,894,943 B2 | 2/2011 | Sloup et al. | |
| 2004/0133406 A1 | 7/2004 | Ozeki et al. | |
| 2006/0100735 A1 | 5/2006 | Hauf et al. | |

(Continued)

OTHER PUBLICATIONS

Qinghui Tang, Tridib Mukherjee, Sandeep K. S. Gupta, Phil Cayton, "Sensro-Based fast thermal evaluation model for energy efficient high performance datacenters", Dec. 2006.*

(Continued)

*Primary Examiner* — Omar Fernandez Rivas
*Assistant Examiner* — Angel Calle
(74) *Attorney, Agent, or Firm* — Vazken Alexanian; Michael J. Chang, LLC

(57) ABSTRACT

Techniques for monitoring and predicting environmental operating conditions in a data center are provided. In one aspect, a method for real-time, three-dimensional analysis of environmental operating conditions in a data center includes the following steps. High spatial resolution three-dimensional measurements of one or more environmental variables in the data center made at a time $t_1$ are obtained. Real-time measurements of the environmental variables in the data center made at a time $t_2$, wherein $t_2$ is later in time than $t_1$, are obtained. The high spatial resolution three-dimensional measurements are combined with the real-time measurements to derive a model for the environmental variables in the data center at the time $t_2$. The model is used to predict three-dimensional distributions of the environmental variables in the data center at the time $t_2$. A base model can be created and used to derive the model for the data center at the time $t_2$.

23 Claims, 11 Drawing Sheets

(56) References Cited

U.S. PATENT DOCUMENTS

| | | | |
|---|---|---|---|
| 2006/0168975 | A1 | 8/2006 | Malone et al. |
| 2006/0255934 | A1* | 11/2006 | Easley et al. ............ 340/539.13 |
| 2007/0032979 | A1* | 2/2007 | Hamann et al. ............... 702/130 |
| 2007/0089446 | A1 | 4/2007 | Larson et al. |
| 2008/0004837 | A1 | 1/2008 | Zwinger et al. |
| 2008/0106437 | A1* | 5/2008 | Zhang et al. ................. 340/945 |
| 2008/0288193 | A1 | 11/2008 | Claassen et al. |

OTHER PUBLICATIONS

Chandrakant Patel, Cullen Bash, Ratnesh Sharma, Moenem Beitelmal, "Smart Data Center", 2003.*

Qinghui Tang, Sandeep Gupta, and Georgios Varsamopoulos, "Thermal Aware Task Placement in Data Centers", Sep. 2007.*

Qinghui Tang, "Thermal-Aware Scheduling in Environmentally Coupled Cyber-Physical Distributed Systems", Jun. 21, 2008.*

Mohammed H. Rahimi, "Bioscope: Actuated sensor network for biological science", Dec. 2005.*

Mohammed H. Rahimi, "Bioscope: Actuated Sensor Network for Biological Science", thesis, Dec. 2005.*

V.R. Joseph et al., "Blind Kriging: A New Method for Developing Metamodels," ASME Journal of Mechanical Design, vol. 130, 031102 (Mar. 2008).

V.R. Joseph, "A Bayesian Approach to the Design and Analysis of Fractionated Experiments," Technometrics, vol. 48, No. 2, pp. 219-229 (2006).

V.R. Joseph, et al., "Functionally Induced Priors for the Analysis of Experiments," Technometrics, vol. 49, No. 1, pp. 1-11 (2007).

Chan et al., "Three-Dimensional Thermal Imaging for Power Equipment Monitoring," IEEE Proc.-Genet. Transnt. Distrib., vol. 147, No. 6 (Nov. 2000).

Merryman et al., "Diagnostic Technique for Power Systems Utilizing Infrared thermal Imaging," IEEE Transactions on Industrial Electronics, vol. 42, No. 6 (Dec. 1995).

Hamann et al., "Rapid Three-Dimensional Thermal Characterization of Large-Scale Computing Facilities," IEEE Transactions on Components and Packaging Technologies (2008).

Y. Joshi, et al., "Reduced Modeling Based Robust Thermal Design of Energy Efficient Data Centers," The Eighteenth International Symposium on Transport Phenomena, Daejeon, Korea (Aug. 27-30, 2007).

Stanford-Clark et al., "MQTT for Sensor Networks (MQTTs)" Protocol Specification, Version 1 (Oct. 2007).

Y.C. Elder et al., "Robust mean-squared error estimation in the presence of model uncertainties," IEEE Transactions on Signal Processing, vol. 53, Issue 1, pp. 168-181 (Jan. 2005).

J.D. Martin, et al., "Use of Kriging Models to Approximate Deterministic Computer Models," AIAA Journal, vol. 43, No. 4, pp. 853-863 (Apr. 2005).

* cited by examiner

300

800

900

1000

1100

1200

1300

1400

TECHNIQUES TO PREDICT THREE-DIMENSIONAL THERMAL DISTRIBUTIONS IN REAL-TIME

CROSS-REFERENCE TO RELATED APPLICATIONS

This application is related to the commonly owned U.S. application Ser. No. 12/146,852, entitled "Techniques for Thermal Modeling of Data Centers to Improve Energy Efficiency," filed herewith on the same day of Jun. 26, 2008, the contents of which are incorporated by reference herein.

FIELD OF THE INVENTION

The present invention relates to data centers, and more particularly, to techniques for monitoring and predicting environmental operating conditions in a data center.

BACKGROUND OF THE INVENTION

The continuing rise of energy consumption of computing hardware systems installed in data centers combined with the cooling infrastructure required to provide operable conditions for this hardware has emerged as a key limitation for future growth in the field of information technology (IT). As a result, undesirable tradeoffs commonly must be made between energy/cooling requirements, space limitations and cost constraints on the one hand and increased IT performance on the other.

A key parameter used to assess environmental conditions in a data center is ambient temperature distribution. Ideally, the ambient temperature would be continuously monitored throughout the entire data center. However, due to the complex physical composition of a data center, current monitoring and/or complete computational fluid dynamics (CFD) modeling techniques can only either provide a one-time snapshot of the entire data center or continuous measurements in a few locations. Making continuous measurements or continuous modeling of an entire data center using conventional techniques is impractical, if at all possible, from both an efficiency and cost standpoint.

Therefore, techniques are needed to continuously monitor temperature conditions throughout an entire data center.

SUMMARY OF THE INVENTION

The present invention provides techniques for monitoring and predicting environmental operating conditions in a data center. In one aspect of the invention, a method for real-time, three-dimensional analysis of environmental operating conditions in a data center is provided. The method comprises the following steps. High spatial resolution three-dimensional measurements of one or more environmental variables in the data center made at a time $t_1$ are obtained. Real-time measurements of the environmental variables in the data center made at a time $t_2$, wherein $t_2$ is later in time than $t_1$, are obtained. The high spatial resolution three-dimensional measurements are combined with the real-time measurements to derive a model for the environmental variables in the data center at the time $t_2$. The model is used to predict three-dimensional distributions of the environmental variables in the data center at the time $t_2$. The high spatial resolution three-dimensional measurements can be used to create a base model and the base model can be combined with the real-time measurements to derive the model for the environmental variables in the data center at the time $t_2$.

In another aspect of the invention, a system for real-time, three-dimensional analysis of environmental operating conditions in a data center is provided. The system comprises a mobile off-line surveying system having a plurality of mobile off-line sensors configured to make high spatial resolution three-dimensional measurements of one or more environmental variables in the data center; a real-time sensing system having a plurality of real-time sensors placed throughout the data center configured to make real-time measurements of the environmental variables in the data center; a first functional module configured to take the high spatial resolution three-dimensional measurements from the mobile off-line surveying system and derive a base model at a time $t_1$ for the environmental variables in the data center; a second functional module configured to combine the base model with real-time measurements from the real-time sensing system at a given time $t_x$ to derive a data center model for the environmental variables in the data center at the time $t_x$, wherein $t_x$ is later in time than $t_1$; a third functional module configured to monitor and compare data output from the data center model and the real-time sensing system; and a fourth functional module configured to derive a set of update parameters for the data center model.

A more complete understanding of the present invention, as well as further features and advantages of the present invention, will be obtained by reference to the following detailed description and drawings.

DETAILED DESCRIPTION OF PREFERRED EMBODIMENTS

Presented herein are techniques for continuously monitoring environmental operating conditions, such as ambient temperature, thermal distributions, humidity, air flow, pressures and power distributions/current consumption, throughout an entire data center, i.e., with high spatial resolution. Thus, the present teachings provide a benefit over conventional data center monitoring techniques. As highlighted above, the conventional techniques can provide only either a spatially dense one-time snap-shot measurement (e.g., performed using a mobile off-line surveying system (MOSS), such as mobile measurement technology (MMT) V1.0, as described in U.S. Pat. No. 7,366,632, issued to Hamann et al., entitled "Method and Apparatus for Three-Dimensional Measurements" (hereinafter "U.S. Pat. No. 7,366,632"), the contents of which are incorporated by reference herein, or one-time computational fluid dynamics (CFD) modeling results) or spatially sparse continuous real-time measurements (e.g., by means of a real-time sensing system (RTSS), as offered by SynapSense of Folsom, Calif.).

When considering each one of these independent approaches, however, some opposing features and disadvantages become apparent. For example, with the MOSS methodology a snap-shot measurement of three-dimensional thermal conditions in a data center can be acquired within a few hours with high spatial resolution. Similarly, with a conventional data center CFD model it can easily take several hours to obtain a result with acceptable accuracy.

In contrast, with a RTSS it is possible to monitor a data center environment continuously (high time resolution) but at significantly reduced spatial resolution, which could only be improved by deploying a much larger number of real-time sensor nodes, at a much elevated cost.

Figure 1:
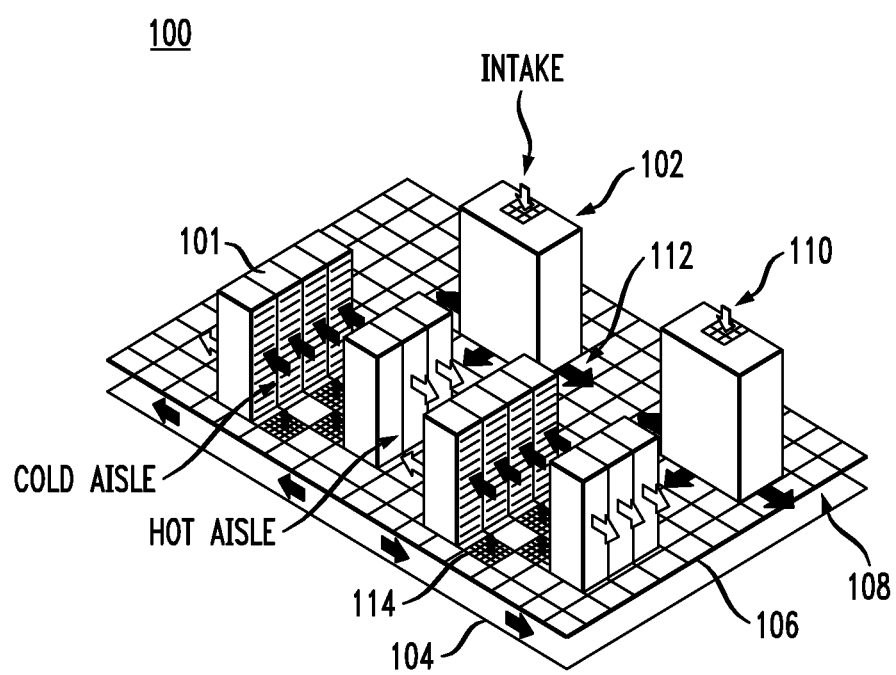
FIG. 1 is a diagram illustrating an exemplary data center according to an embodiment of the present invention.

FIG. 1 is a diagram illustrating exemplary data center 100. Data center 100 has information technology (IT) equipment racks 101 and a raised-floor cooling system with air conditioning units (ACUs) 102 (also commonly referred to as computer room air conditioning (CRAC) units) that take hot air in (typically from above) and exhaust cooled air into a sub-floor plenum below. Hot air flow through data center 100 is indicated by light arrows 110 and cooled air flow through data center 100 is indicated by dark arrows 112.

In FIG. 1, IT equipment racks 101 use front-to-back cooling and are located on raised-floor 106 with sub-floor 104 beneath. Namely, according to this scheme, cooled air is drawn in through a front of each rack and warm air is exhausted out from a rear of each rack. The cooled air drawn into the front of the rack is supplied to air inlets of each IT equipment component (servers for example) therein. Space between raised floor 106 and sub-floor 104 defines the sub-floor plenum 108. The sub-floor plenum 108 serves as a conduit to transport, e.g., cooled air from the ACUs 102 to the racks. In a properly-organized data center (such as data center 100), the IT equipment racks 101 are arranged in a hot aisle—cold aisle configuration, i.e., having air inlets and exhaust outlets in alternating directions. Namely, cooled air is blown through perforated floor tiles 114 in raised-floor 106, from the sub-floor plenum 108 into the cold aisles. The cooled air is then drawn into IT equipment racks 101, via the air inlets, on an air inlet side of the racks and dumped, via the exhaust outlets, on an exhaust outlet side of the racks and into the hot aisles.

The ACUs typically receive chilled water from a refrigeration chiller plant (not shown). The ACUs, refrigeration chiller plant and various other related components and structures directed to cooling the data center make up a cooling infrastructure for the data center. Each ACU typically comprises a blower motor to circulate air through the ACU and to blow cooled air, e.g., into the sub-floor plenum. As such, in most data centers, the ACUs are simple heat exchangers consuming power needed to blow the cooled air into the sub-floor plenum.

Typically, one or more power distribution units (PDUs) (not shown) are present that distribute power to IT equipment racks 101. As will be described in detail below, power consumption by the PDUs can be an important consideration in the present techniques. In general, since the PDUs supply electrical power required by the IT equipment in a data center, a total electrical power intake of the PDUs represents an important parameter in determining the energy efficiency of a data center.

Data center 100 comprises one or more real-time sensors (not shown) which are part of an RTSS. The placement of the real-time sensors throughout the data center will be described in detail below. With the present techniques, for example, combined MOSS and RTSS technologies are employed to accurately model and analyze three-dimensional thermal and heat distributions in a data center in real-time.

Figure 2:
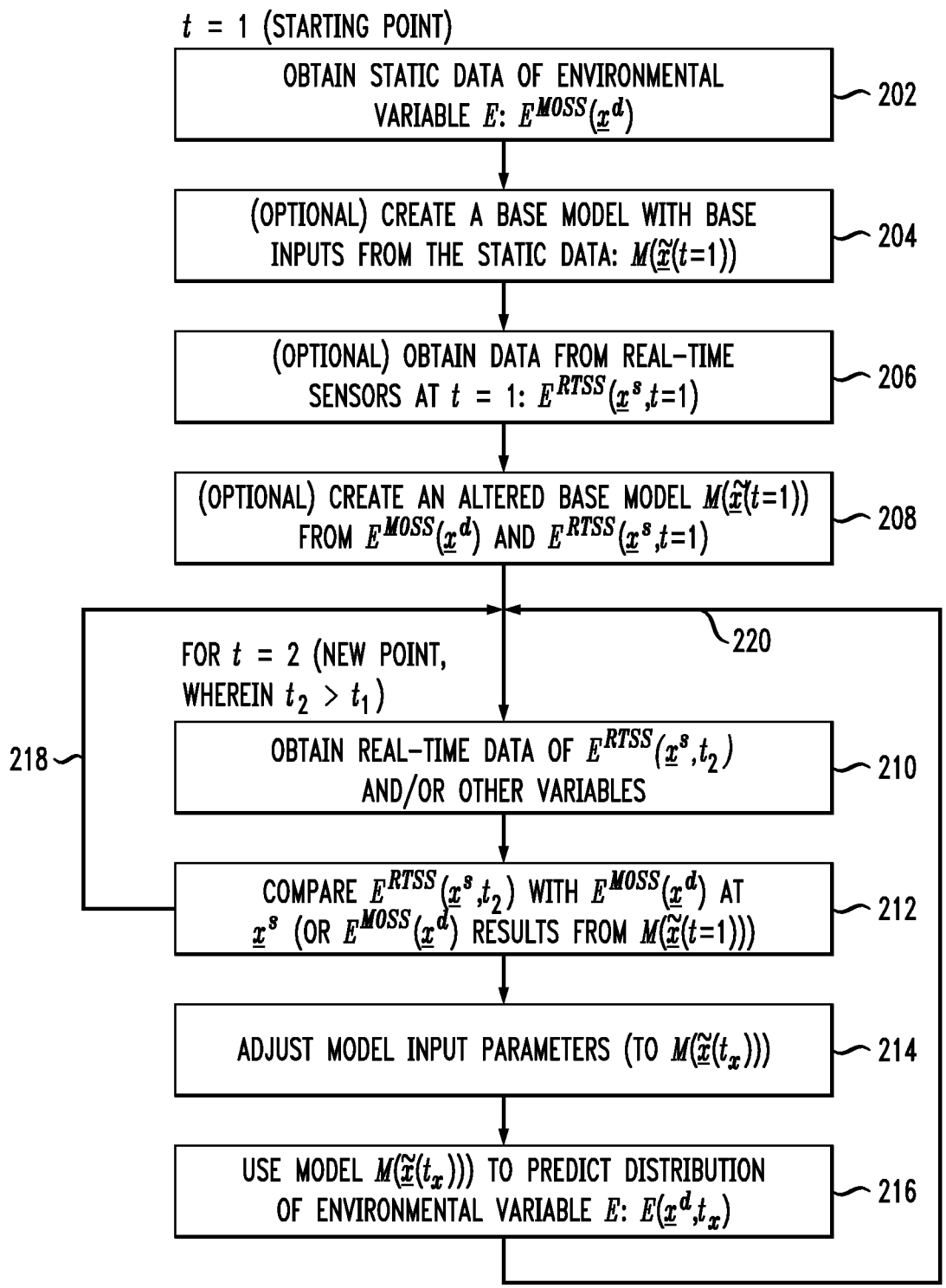
FIG. 2 is a diagram illustrating an exemplary methodology for real-time, three-dimensional analysis of environmental operating conditions in a data center according to an embodiment of the present invention.

FIG. 2 is a diagram illustrating exemplary methodology 200 for real-time, three-dimensional analysis of environmental operating conditions in a data center. In step 202, static three-dimensional measurements made of one or more of the environmental variables E in the data center, such as thermal conditions (i.e., ambient temperatures and/or thermal distributions), humidity, air flow, pressures and power distributions/current consumption, at an initial point in time $t_1$, are obtained. The static three-dimensional measurements of the environmental variables in the data center are made using a MOSS ($E^{MOSS}(\underline{x}^d)$), wherein $\underline{x}^d$ is a vector of a dense set of spatial coordinates. According to an exemplary embodiment, the MOSS used is MMT V1.0. However, any suitable MOSS can be used to measure and/or model environmental variables in the data center. For example, $E^{MOSS}(\underline{x}^d)$ could also be obtained from the results of a conventional CFD modeling approach of the data center. In some instances, extrapolation/interpolation to areas of the data center that are not accessible during the MMT survey is required.

The present techniques can be used to extend the corresponding capabilities of MMT V1.0. MMT V1.0 is a technology for optimizing data center infrastructures for improved energy and space efficiency which involves a combination of advanced metrology techniques for rapid measuring/surveying data centers (see, for example, U.S. Pat. No. 7,366,632) and physics-based modeling techniques for optimizing a data center facility within a given thermal envelope for optimum space and most-efficient energy utilization (see, for example, U.S. application Ser. No. 11/750,325, filed by Claassen et al., entitled "Techniques for Analyzing Data Center Energy Utilization Practices," (hereinafter "Claassen"), the contents of which are incorporated by reference herein).

The "static" MMT measurements (see, for example, U.S. Pat. No. 7,366,632) can provide essential data to build a base model of the respective data center (see step 204, described below). According to one exemplary embodiment, the static MMT measurements comprise three-dimensional thermal measurements, as well as air flow measurements at various levels of the IT equipment racks (e.g., IT equipment racks 101 of data center 100). Additionally, to determine total power consumption of a data center, power measurements of the PDUs are desirable, as well as a complete survey of operational parameters of the ACUs. The operational parameters of the ACUs can include, but are not limited to, inlet and outlet air flows of the ACUs and/or air temperature differentials between the inlets and outlets of the ACUs. For example, based on the three-dimensional thermal/air flow measurements and the operational parameters of the ACUs, an estimate of total thermal energy produced in a data center can be inferred and compared with direct power usage measurements (i.e., based on the fact that a total electrical energy consumed within the confines of a data center equates with the total thermal energy produced in that data center). In some cases, a combination of the PDU power measurements and name plate data (which may be available from data center asset databases) together with corresponding power distribution wiring schematics, can be used to determine power consumption of individual IT equipment components (i.e., power distribution). This approach allows for the power consumption of IT equipment components/IT equipment racks to be verified by comparing a spatial location of the components/racks with related MMT-based three-dimensional thermal maps.

MMT V1.0 allows for measurement of the environmental variables of the data center with a high spatial resolution. MMT V1.0, for example, is able to measure temperatures in a data center with a three-dimensional spatial resolution of less than one cubic foot. Exemplary MMT measurements are shown illustrated, for example, in FIG. 10 (described below). See also, Hamann et al., "Rapid Three-Dimensional Thermal Characterization of Large-Scale Computing Facilities," IEEE Transactions on Components and Packaging Technologies (2008), the contents of which are incorporated by reference herein. While MMT V1.0 is currently the only technology which can provide experimental insight into environmental variables such as temperatures in a data center at this uniquely high spatial resolution, an MMT survey is still only a "snapshot" at a given point in time of the MMT service. Namely, while MMT provides high spatial resolution, it is typically temporally sparse, e.g., performed once or twice a year for a given data center.

In step 204, the static three-dimensional measurements from MMT V1.0 are used to create a base model M for the one or more environmental variables in the data center, i.e., $M(\tilde{x}(t_1))$, wherein $\tilde{x}$ is a vector of input parameters, such as power, flows, spatial coordinates and/or dimensions, for the model. The derivation of a base model (step 204) and manipulation thereof (steps 206/208, described below) are optional steps because, as is described in detail below, direct use of the static data (from time $t_1$) and real-time data obtained at a time $t_2$ (wherein $t_2$ is later in time than $t_1$, i.e., $t_2>t_1$) can be used directly to model the data center.

In general, the models described herein are used to predict, describe and/or represent the environmental variables in space, and possibly time, i.e., $$M(\tilde{x}) \Leftrightarrow E(\underline{x},t)$$

wherein M is the particular model, E is an environmental variable, such as thermal conditions, humidity, air flow, pressures and power distributions/current consumption, $\tilde{x}$ is a vector of input parameters for the model, such as power, flows, spatial coordinates and/or dimensions, $\underline{x}$ is a vector of dimensional variables (x, y, z), determining a location inside a data center, and t is time.

In the base model, there are a fixed set of input parameters and $\tilde{x}$ is not a function of time, i.e., $M(\tilde{x}(t_1)) \Leftrightarrow E(\underline{x})$. By contrast, in a subsequent model created at time $t_2$ (see below) (wherein $t_2>t_1$), also referred to herein as a "dynamic model," $M(\tilde{x}(t_2)) \Leftrightarrow E(\underline{x},t_2)$, the input parameters $\tilde{x}$ can change as a function of time and therefore are adjusted based on the latest sensor readings. $\underline{x}$ and $\tilde{x}$ can have common elements but that is not required.

According to the present techniques, one or more of the following types of base models may be derived: a direct measurement model, a statistical model (i.e., fitting the MMT measurements to an analytical model), a physics-based model and a combination of at least one of the foregoing types of models. Suitable statistical models include, but are not limited to, Kriging techniques and interpolation schemes (e.g., linear, polynomial, Hermite and cosine models) and reduced order models, such as proper orthogonal decomposition (POD) models (see for example, Y. Joshi, et al., "Reduced Modeling Based Robust Thermal Design of Energy Efficient Data Centers," The Eighteenth International Symposium on Transport Phenomena, Daejeon, KOREA (Aug. 27-30, 2007), the contents of which are incorporated by reference herein). Suitable physics-based models include, but are not limited to, zoning/provisioning models and simplified heat convection/conduction models. See, for example, U.S. application Ser. No. 12/146,852, entitled "Techniques for Thermal Modeling of Data Centers to Improve Energy Efficiency," filed on Jun. 26, 2008, (hereinafter "U.S. Application Ser. No. 12/146,852"), the contents of which are incorporated by reference herein. As an example, the base model could also be constructed by the well-known Navier-Stokes-CFD modeling as well. Navier-Stokes-CFD modeling is described, for example, in U.S. application Ser. No. 12/146,852. It is also notable that all information about the data center that is relevant to assess energy consumption of the data center, such as the cooling system (refrigeration chiller plant technologies, refrigeration chiller plant coefficient of performance (COP) and outside temperatures), PDUs and perforated floor tiles, is included. Example 3 below provides an indication of how such infrastructure information can be used in the models.

The direct measurement model involves the direct use of the MMT measurements, for example, by arranging the MMT measurements in a data base, where each entry represents location coordinates (x,y,z) and associated measurement (value), e.g., (x, y, z; value). With the use of a statistical model of the data center, the thermal/air flow measurements are represented as a function of one or more variables, such as sensor location (where the sensors can be part of a MOSS network (base model) and/or an RTSS network (dynamic model, described below)), type of perforated floor tiles present and/or positioning of cooling air inlets/hot air outlets of an IT rack. Perforated floor tiles are typically characterized by their "opening" (e.g., 25 percent (%)) or flow impedance, or (as herein) by an amount of flow they provide. The "opening" is useful to calculate pressure under the data center floor.

Compared to the zoning/provisioning model (see above), for example, the quality of the statistical model can benefit from a larger number of relevant input factors or data, such as the data provided by real-time sensors.

Kriging/interpolation models are described in detail below. The term "Kriging," as described below, refers to a known interpolation method to predict unknown values from data measured at known locations. Known Kriging models include ordinary Kriging and universal Kriging. Ordinary Kriging includes, for example, spherical, circular exponential and linear methods, and assumes that a spatial variation in z-values is free of any structural component (drift). On the other hand, universal Kriging assumes that the spatial variation in z-values is the sum of three components, i.e., a structural component (drift), a random spatially correlated component and random noise representing residual errors. POD is a method to numerically predict velocity and temperature fields more efficiently than full-field simulations. The velocity and temperature fields are expanded into basis functions or POD modes. It can be shown that the basis functions can be represented as a matrix, where each column includes a complete velocity or temperature field data of an observation. These observations can come from measurements or CFD calculations.

For the physics-based models, such as the zoning/provisioning model illustrated immediately below, the MMT methodology yields modeling parameters for each of the IT equipment racks based on supplied air flow and temperature differentials, as well as the resulting temperature fields that surround each rack. For example, with the zoning/provisioning model, the data center is separated into different zones being fed by the individual ACUs. With this method, a provisioning zone is assigned to each ACU within a data center, i.e., this model assumes that cooling air supplied to each such zone is provided by the assigned ACU. The zone assignment can be done using air flow modeling with the base model. The MMT V1.0 air flow data is used to create zones, wherein each zone corresponds to an ACU. For example, if the discharge temperature of a particular ACU changes (e.g., read via RTSS with a sensor at an air outlet of the ACU), the corresponding zone temperatures change accordingly. Specifically, air flow sinks and sources can be identified in the data center using MMT V1.0 and an air flow model created, for example, as described in U.S. application Ser. No. 12/146,852 (another physics-based model). Other zoning concepts may use air flow from the respective ACU in conjunction with total data center area by geometrically partitioning up the total area in accordance with flow and position of the ACU. A model in the form of a spatial thermal footprint of each individual IT equipment rack can be evaluated by taking a ratio between an average temperature of (cooled) air provided to the air inlets of the IT equipment components in each rack and known or interpolated temperatures of air surrounding the IT equipment components.

In general, the category of physics-based models (also referred to herein as physics-driven models) includes, for example, the models described in U.S. application Ser. No. 12/146,852 (which also provides a description of simplified convection/conduction models that may be used herein) as well as the presently described zoning/provisioning models. Other suitable physics-based models may also be implemented, however Navier-Stokes-CFD models are generally excluded from use herein primarily because physics-based models are simpler (faster) to run than Navier-Stokes-CFD models (although standard CFD models may be used). With the zoning/provisioning models, what is first described is how to create zones and then how to use a provision concept.

In step 206, measurements from the real-time sensors made also at time $t_1$, i.e., $E^{RTSS}(\underline{x}^s, t_1)$, can be obtained to use in creating the base model. According to an exemplary embodiment, the real-time measurements are made using a RTSS that employs real-time sensors placed throughout the data center that continuously monitor the environmental operating conditions. See, for example, the description of FIG. 1, above. Implementing measurements from the real-time sensors for the base model is particularly useful if the real-time sensors do not align with the MOSS base survey/measurements, i.e., if $\underline{x}^s$ is not a subset of $\underline{x}^d$ and $E^{RTSS}$ needs to be referenced to $E^{MOSS}$. In this case, step 206 is performed to calibrate the RTSS by adjusting the base model (see step 208, described below).

In step 208, based on the real-time sensor readings taken in step 206, described above, an altered base model ($M(\tilde{\underline{x}}(t=0))$) is created that includes both $E^{RTSS}(\underline{x}^s, t_1)$ and $E^{MOSS}(\underline{x}^d)$, e.g., using sensor data fusion as described in detail below. Thus, strictly speaking, $\tilde{\underline{x}}$ in step 204 is different from $\tilde{\underline{x}}$ in step 208. For example, if sensor data fusion is used then there will be different spatial coordinates in step 208 as compared to step 204. Like step 204 (described above), steps 206 and 208 are also optional. For example, the base model can be created from the MMT V1.0 measurements (step 204), but it is not always necessary to obtain measurements from the real-time sensors at time $t_1$ and/or alter the base model (steps 206 and/or 208, respectively).

In step 210, real-time measurements of the environmental variables in the data center made at a time $t_2$ (wherein $t_2$ is later in time than $t_1$, i.e., $t_2 > t_1$) are obtained. As in step 206, above, the real-time measurements can be made using a RTSS that employs real-time sensors placed throughout the data center that continuously monitor the environmental operating conditions.

The real-time sensors can comprise any type of sensor which monitors a relevant physical quantity, such as the environmental variables highlighted above, namely thermal conditions (i.e., ambient temperatures and/or thermal distributions), humidity, air flow, pressures and power distributions/current consumption, in real-time. The sensors can be wired or wireless. In many instances, these real-time sensors are already present as part of a building monitoring system. The placement of the real-time sensors is guided by which of the data center model(s), described above, is being used. By way of reference to an exemplary embodiment wherein a Kriging model is used, statistical sampling methods can also be used to determine both an optimum number and locations of real-time sensors for a given data center. Other exemplary methods for placing real-time sensors can involve use of (Latin) hypercube sampling techniques, described below.

Additional and/or existing real-time sensors placed in the data center can also be used to verify the base model prediction, if made, and to determine whether any additional surveys with the MOSS, i.e., MMT V1.0, need to be done. For example, mean-square error (MSE) can be determined between data obtained from the real-time sensors at time $t_2$ and corresponding predictions from the base model. In this case, the MSE serves to indicate whether or not a new survey with the MOSS is required to readjust the base model for obtaining improved predictions. As highlighted above, the creation of a base model is optional, and embodiments are presented herein wherein a base model is not used in the data center analysis.

As compared to the MMT measurements, the real-time sensors provide (relatively) low spatial resolution, i.e., the real-time sensors are sparsely placed throughout the data center. This is due, at least in part, to the expense associated with the deployment, use and continual operation of real-time sensors. However, as highlighted above, the MMT measurements are temporally sparse, e.g., performed once or twice a year for a given data center, whereas the real-time sensors can provide measurements in real-time, or near real-time, e.g., with measurement intervals on an order of seconds or minutes.

The MMT surveys and the real-time sensors both provide measurements of one or more environmental variables E. The difference between the MMT surveys $E^{MOSS}(\underline{x}^d)$ and the real-time sensor data ($E^{RTSS}(\underline{x}^s, t_1)$) is given by the spatial coordinates, wherein $\underline{x}^s$ is a vector with a sparse set of spatial coordinates while $\underline{x}^d$ is a vector of a dense set of spatial coordinates. As highlighted above, $\underline{x}^s$ can be a subset of $\underline{x}^d$ but that is not required. Further, measurements are provided from the MMT surveys at $t_1$ (not in real-time). In some embodiments presented herein, the real-time sensors are used to monitor one or more of the modeling input parameters, such as changing power levels $\tilde{x}(t_2)$.

The measurements obtained from the real-time sensors are used to adjust the data center model as a function of the differences in data, if any, from the time when the MMT measurements were taken to the present, i.e., from time $t_1$ to time $t_2$. This approach thus provides a real-time (or near real-time) analysis of the environmental operating conditions in the data center.

For example, in step 212, the base model is combined with the real-time measurements from the RTSS, i.e., combine $M(\tilde{x}(t_1))$ with $E^{RTSS}((\underline{x}^s, t_2))$, to derive a "dynamic" model for the environmental operating conditions in the data center at time $t_2$, i.e., $M(\tilde{x}(t_2))$. This can be achieved, for example, by applying known methods of sensor data fusion, i.e., by combining the real-time sensor measurements and base model data, such that the resulting model at time $t_2$ produces an output of better quality (i.e., more accurate, more complete and/or more dependable modeling results) than the base model alone. In general, sources of data for the data fusion process can include measurements from one or more of a number of different types of sensors, such as wireless sensors, wired sensors or a combination thereof, that can provide real-time data. However, any data representing a measure of the existing environmental status of the data center would be useful in providing accurate up-to-date models. Further, any suitable data fusion techniques may be employed, such as direct fusion, indirect fusion and/or fusion of outputs of the direct and indirect fusion. Direct fusion generally refers to fusion of sensor data from a set of (real-time) heterogeneous (multiple-sensor) sensors and historic (i.e., MMT-based) sensor data, while indirect fusion uses information sources like a priori knowledge about the environment and/or human input. An example illustrating the derivation of a data center model wherein a base model is first created is provided in Example 2, described below.

However, as described above, the creation of the base model is optional. Thus, alternatively, in step 212, the measurements from the MMT survey, i.e., $E^{MOSS}(\underline{x}^d)$ (see description of step 202, above), can be combined with measurements from the real-time sensors, i.e., $E^{RTSS}(\underline{x}^s, t_2)$, using the data fusion processes described immediately above, to derive a model for the data center at time $t_2$, i.e., $M(\tilde{x}(t_2))$. An example illustrating the derivation of a data center model without first creating a base model is provided in Example 1, described below.

Like the base model described above, the "dynamic" model $M(\tilde{x}(t_2))$ can comprise one or more of a direct measurement model, a statistical model, a physics-based model and a combination of at least one of the foregoing types of models. Suitable statistical models include, but are not limited to, Kriging techniques and interpolation schemes (e.g., linear, polynomial, Hermite and cosine models) and reduced order models, such as POD models. Suitable physics-based models include, but are not limited to, zoning/provisioning models and simplified heat convection/conduction models. Each of these model types were described in detail above.

Since the RTSS is continually monitoring the environmental operating conditions in the data center, any changes in the environmental operating conditions measured by the RTSS and that are, for example, large enough to meet the above-mentioned MSE criterion, will change the dynamic model, accordingly. By way of example only, if external influences and/or disturbances to the data center infrastructure occur, such as the installation of new IT equipment, any changes to the environmental operating conditions in the data center brought about by these influences and/or disturbances will be detected by the real-time sensors, for example at time $t_x$ (wherein $t_x$ is later in time than $t_2$), and a corresponding change(s) to the dynamic model will occur. The result will be an updated data center model at time $t_x$, i.e., $M(\tilde{x}(t_x))$. This scenario is illustrated, for example, by arrow 218 in FIG. 2 indicating that steps 210 and 212 of methodology 200 can be repeated in response to the continuous monitoring of influences and/or disturbances by the real-time sensors. The changing of the dynamic model in response to a change in the environmental operating conditions in the data center is described, for example, in conjunction with the description of step 214, below.

Namely, in step 214, a set of update parameters is derived for the data center model, $M(\tilde{x}(t_x))$, provided that the chosen MSE criterion indicates that such an update will be necessary. Thus, whether or not a new set of update parameters needs to be derived depends on the error criterion (for example, besides the MSE, such an error criterion can be the absolute error between measured and modeled quantities). Error (absolute or MSE) values below some defined threshold value do not lead to any update action. Some analytic details on this procedure are provided below.

A basic high-level example is now provided that illustrates the update procedure of a temperature model using real-time sensing and dynamic models. As an example, consider the following simple method for combining real-time temperature data, $T(t_m; \vec{r}_s)$, measured at an actual time $t_m$ at sensor locations $\vec{r}_s = (x_s, y_s, z_s)$, with corresponding data generated by an MMT-based temperature model, $\tilde{T}(t_0; \vec{r})$, earlier validated at time $t_0 < t_m$ for $\vec{r} = (x, y, z) \in \vec{R}$, wherein $\vec{R}$ represents a validated location domain of the model. Based on the error functional, $$\Delta T(t_m; \vec{r}_s) = T(t_m; \vec{r}_s) - \tilde{T}(t_0; \vec{r} = \vec{r}_s),$$

and the application of some suitable interpolation or fitting technique, such as a Kriging methodology described above, an estimator for the error functional, $\Delta \hat{T}(t_m; \vec{r})$, can be obtained for any required position vector $\vec{r} = (x, y, z) \in \vec{R}$ not covered by the real-time sensor system network. The original MMT-based model $\tilde{T}(t_0; \vec{r})$ can then be updated to reflect an improved model for the temperature distribution at time $t_m > t_0$, e.g., by applying a simple superposition approach:

$$\tilde{T}(t_m; \vec{r}) \leftarrow \tilde{T}(t_0; \vec{r}) + \Delta \hat{T}(t_m; \vec{r}).$$

This and more sophisticated approaches to fusion of real-time data and corresponding historic models can be extended to environmental parameters other than temperature, e.g., parameters such as humidity, air flow, pressures and power distributions/current consumption.

In step 216, the updated model, in this example, $M(\tilde{x}(t_x))$, is then used to predict a three-dimensional distribution of the one or more environmental variables E in the data center at time $t_x$, i.e., $E(\underline{x}^d, t_x)$. Steps 210, 212, 214 and 216 of methodology 200 can be repeated, as indicated by arrow 220 in FIG. 2, to insure that the data center model is kept updated. Two examples illustrating the derivation of a data center model are provided in Example 1 and Example 2, described below.

Figure 3:
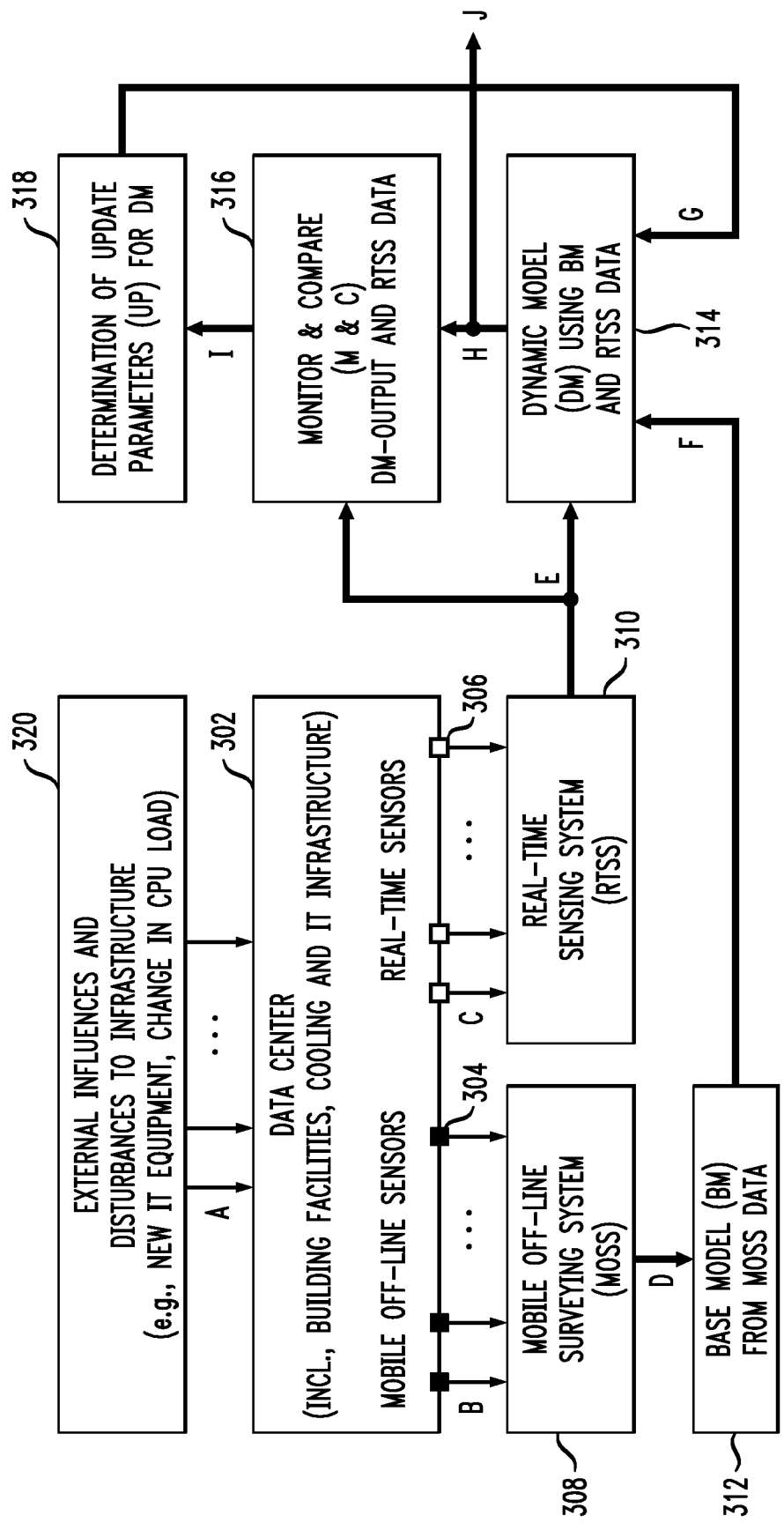
FIG. 3 is a diagram illustrating an exemplary system for real-time, three-dimensional analysis of environmental operating conditions in a data center according to an embodiment of the present invention.

FIG. 3 is a diagram illustrating exemplary system 300 for implementing methodology 200, described in conjunction with the description of FIG. 2, above. Real-time sensors 306 are placed throughout data center 302 and, as described above, can comprise any type of sensor which measures physical quantities, such as thermal conditions (i.e., ambient temperatures and/or thermal distributions), humidity, air flow, pressures and power distributions/current consumption, in real-time or near real-time, e.g., with measurement intervals on an order of seconds or minutes. Real-time sensors 306 can be wired or wireless.

Mobile off-line sensors 304, shown in FIG. 3, are part of a MOSS 308. Mobile off-line sensors 304 can comprise any type of sensor which measures physical quantities, such as thermal conditions (i.e., ambient temperatures and/or thermal distributions), humidity, air flow, pressures and power distributions/current consumption. Mobile off-line sensors 304 can be wired or wireless. According to an exemplary embodiment, MOSS 308 comprises MMT V1.0 having the mobile off-line sensors 304 associated therewith, such that when MMT V1.0 is moved throughout data center 302 readings can be taken. One or more of mobile off-line sensors 304 may also be temporarily or permanently mounted at a location(s) in the data center. Real-time sensors 306 are part of RTSS 310. The placement of the real-time sensors 306 will be described in detail below. For example, as highlighted above, (Latin) hypercube sampling techniques can be applied to place real-time sensors 306 in real-time. Output from mobile off-line sensors 304 (output labeled "B") and real-time sensors 306 (output labeled "C") are fed into MOSS 308 and RTSS 310, respectively.

Measurements made by MOSS 308 (output labeled "D") are taken and used by functional module 312 to derive a base model (labeled "BM") at time $t_1$ for one or more environmental variables data center 302. Measurements from RTSS 310 combined with data from the base model (output labeled "F") are used by functional module 314 to derive a "dynamic" data center model (labeled "DM") for the one or more environmental variables in data center 302 at time $t_x$, wherein $t_x$ is later in time than $t_1$, i.e., $t_x > t_1$. As described in detail in conjunction with the description of FIG. 2, above, the measurement data output from the RTSS (output labeled "E") and the output of the "dynamic" model (output labeled "H") are monitored and compared. According to an exemplary embodiment, functional module 316 performs the monitoring and comparing functions (M&C).

Due to an occurrence(s) 320 of one or more changes to data center 302, such as external influences and disturbances to the infrastructure of data center 302 (labeled "A"), e.g., the installation of new IT equipment, changes in the cooling infrastructure and/or rebalancing of an operational load of the IT equipment, a set of update parameters for the dynamic model are determined by functional module 318. As described in detail in conjunction with the description of FIG. 2, above, the set of update parameters (labeled "UP") are used to adjust the dynamic model, i.e., based on output from functional module 316 (output labeled "I"). The output of the dynamic model can also be used, e.g., via a broker mechanism, by any one of a number of data center applications (output labeled "J"). See, for example, FIG. 4, described below.

Like functional modules 312, 314, 316 and 318, described above, MOSS 308 and RTSS 310 may also be thought of as functional modules of system 300. Namely, MOSS 308 functions in making static measurements of the environmental operating conditions in data center 302, as described above. Similarly, RTSS 310 functions in making real-time measurements of the environmental operating conditions in data center 302, as described above.

According to an exemplary embodiment, the functional modules further comprise appropriate interfaces that enable them to communicate with each other and with other components (e.g., application software) by means of a messaging protocol based on a publish-subscribe principle. By way of example only, real-time sensors 306, which are part of RTSS 310, use such a protocol (for example message queue telemetry transport (MQTT) protocol or its version for wireless sensors (MQTT-S). MQTT-S is described, for example, in Stanford-Clark et al., "MQTT for Sensor Networks (MQTTs)" Protocol Specification, Version 1 (October 2007) (available at www.mqtt.org), the contents of which are incorporated by reference herein. This message-based method for communicating between system components has the advantage that application developers do not need to consider the intrinsic details of the various communication protocols and addressing schemes, since a message broker (e.g., a broker as shown in FIG. 4, described below) takes care of these functions.

Figure 4:
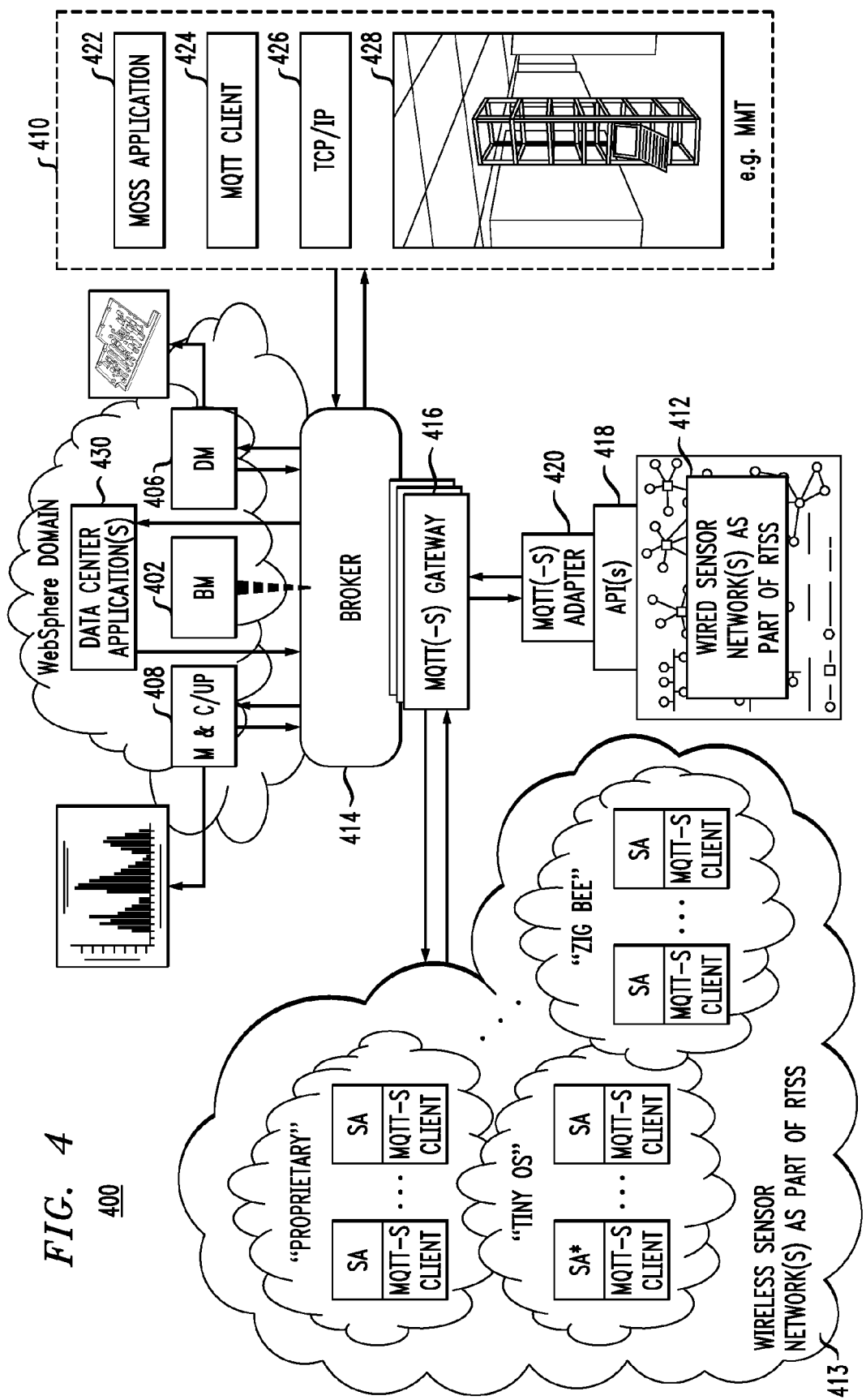
FIG. 4 is a diagram illustrating an exemplary communication architecture for the system of FIG. 3 according to an embodiment of the present invention.

FIG. 4 is a diagram illustrating exemplary communication architecture 400 for system 300 (described in conjunction with the description of FIG. 3, above). In communication architecture 400, the functional module used to derive the statistical base model (labeled "BM"), the functional module used to derive the dynamic model (labeled "DM") and the functional modules used to perform the monitoring/comparing functions and to determine the set of update parameters for the dynamic model (labeled "M&C/UP"), i.e., functional modules 402, 406 and 408, respectively, which are part of a WebSphere domain, can communicate and/or exchange their data with MOSS functional module 410 and RTSS wired sensors functional module 412 and/or wireless sensors functional module 413 through a message broker mechanism (e.g., broker 414).

Broker 414 comprises one or more MQTT/MQTT-S gateways 416 through which communication/exchange can take place based on a publish-subscribe protocol for wireless sensor networks. Namely, RTSS wired sensors 412 and/or wireless sensors 413 can communicate/exchange data through the MQTT/MQTT-S gateways 416. Although the MQTT-S protocol was designed for wireless sensors, it is equally applicable to wired sensors, thereby providing its advantages to both types of sensors. These advantages include modest memory requirements and low transmission overhead. Alternately, wired sensors can also use the basic but more complex MQTT protocol.

As shown in FIG. 4, a variety of wireless sensor network platforms can be employed, e.g., for the plurality of sensor applications (labeled "SA") in the wireless sensor network(s) of the RTSS. By way of example only, Proprietary, ZigBee and TinyOS are suitable wireless sensor network platforms that may be employed.

The RTSS wired sensor functional module 412 can comprise application programming interfaces (labeled "API(s)") 418 and an MQTT/MQTT-S adapter 420 which permits interface with MQTT/MQTT-S gateways 416. The MOSS functional module 410 can comprise MOSS application 422, MQTT client 424, communication protocols 426, i.e., transmission control protocol (TCP)/internet protocol (IP) (labeled "TCP/IP") and MMT functional module 428. MOSS application 422 is an off-line software program, which receives data from MMT functional module 428 for post-processing either directly via an MQTT client 424 or a TCP/IP network or both. Typically, MOSS application 422 consolidates MMT-based measurement data and infrastructure information of a surveyed data center to produce suitable input for functional module BM 402.

According to the exemplary embodiment shown illustrated in FIG. 4, base model functional module 402, monitor/compare and update parameter functional modules 408, together with the dynamic model functional module 406, act as both subscribers as well as publishers, through the (MQTT) broker 414. In addition, one or more published outputs of these functional modules 402, 406, 408 can be accessed by one or more of data center application(s) 430 via the broker 414, provided that these application(s) are registered at the broker as subscribers to the particular outputs of interest. Exemplary data center applications which could benefit from this messaging approach, include, but are not limited to, various kinds of asset and energy management software for data centers, such as Maximo, Maximo-Spatial products and Active Energy Manager (AEM).

Figure 5:
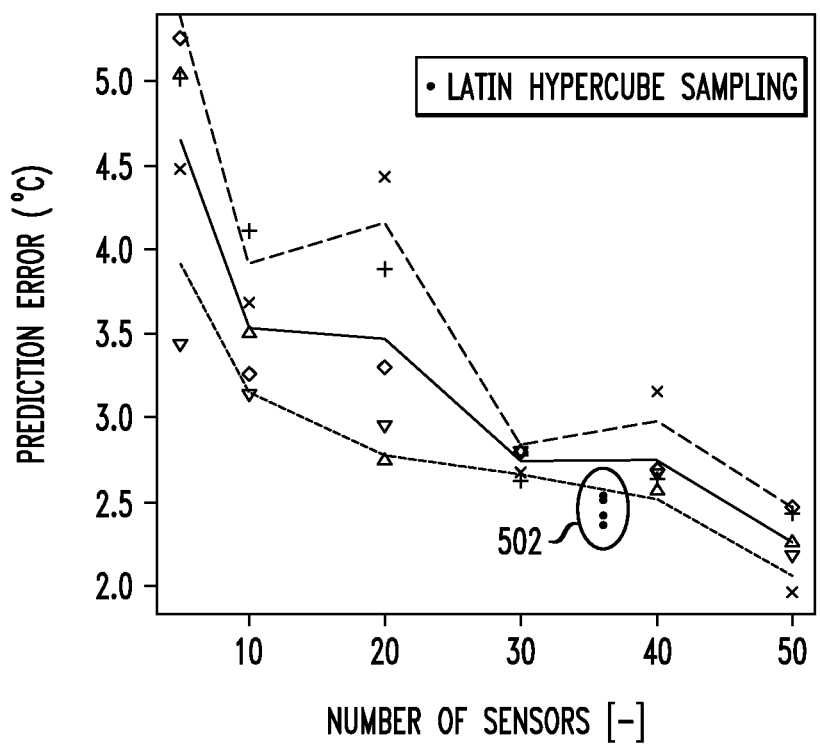
FIG. 5 is a graph illustrating a dependence of dynamic model prediction error on a number and location of sensors according to an embodiment of the present invention.

FIG. 5 is graph 500 illustrating, for a given data center, the dependence of dynamic model prediction error on a number of sensors used and their location. In this example, the environmental variable used is temperature, measured in degrees Celsius (° C.). Namely, in graph 500, the temperature prediction error is plotted as a function of the number of sensors for sensor arrangements at five different locations (each arrangement is given a different symbol in the graph). As shown in graph 500, for a given number of sensors, the prediction error can vary. This variation is due, at least in part, to the locations of the sensors throughout the data center. Specifically, choosing sensor location properly can increase prediction accuracy. By way of example only, the points in graph 500 within circle 502 correspond to sensor number and location parameters selected from a sampling of Latin hypercube designs and which exhibit favorable prediction accuracy. Latin hypercube designs will be described in detail below.

Based on measurement data from the MOSS, i.e., MMT V1.0 (see, for example, step 202 of FIG. 2, described above), statistical sampling methods can be used to determine both the optimum number of sensors (e.g., using an ordinary Kriging model) and the optimum sensor locations, for a given data center. For example, based on MMT V1.0 temperature data, those locations within the data center can be identified where temperature values are either extremely high (hot spots) or extremely low (over-provisioned cooling). Sensors can then be placed at, or in the vicinity of, these locations to cover an entire range of expected temperatures. Further, additional sensors can be placed in locations with large temperature gradients (i.e., in locations where MMT V1.0 measurements indicate abrupt temperature changes). As indicated above, in one exemplary embodiment, MSE could be used between the real-time measurement data and corresponding model predictions. Any real-time sensor placement procedure should then try to minimize the resulting MSE, for example, by using the placement procedures above, such as placing sensors at high/low temperature spots. It should be noted that the MSE of an estimator (e.g., in the present context the output of the dynamic model for a given data center) is one of a number of different ways to quantify an amount by which an estimator differs from the true value of the quantity being estimated. For example, it is well-known that the MSE criterion measures an average (expectation) of the square of the prediction error, wherein the prediction error is the amount by which the estimator is expected to differ from the quantity to be estimated. Often, the root mean square error (RMSE), i.e., the square root of the MSE, is estimated. Variations of the MSE/RMSE estimator are also possible, for example, as provided in Y. C. Eldar et al., "Robust mean-squared error estimation in the presence of model uncertainties," IEEE Transactions on Signal Processing, vol. 53, Issue 1, pp. 168-181 (January 2005), the contents of which are incorporated by reference herein.

Figure 6:
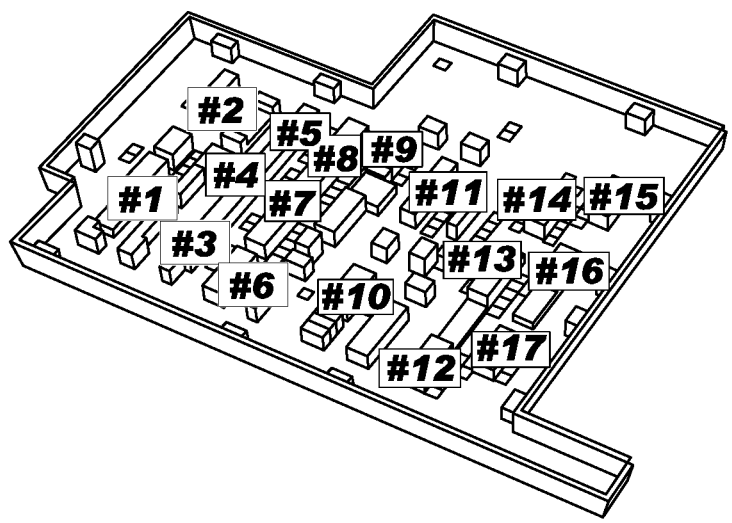
FIG. 6 is a diagram illustrating an exemplary data center which yields an irregular experimental region for Latin hypercube design according to an embodiment of the present invention.

As highlighted above, as an alternate method for placing real-time sensors, Latin hypercube designs can be used to determine an optimum number of real-time sensors and their placement in a data center. According to the present techniques, space-filling Latin hypercube designs are used, i.e., designs that spread points evenly throughout an experimental region are often employed. One challenge, however, associated with using space-filling designs in the context of a data center is that a data center generally yields an irregular experimental region. By way of example only, FIG. 6 is a diagram illustrating exemplary data center 600. As an example, 17 sensors (labeled "#1" through "#17") are shown placed throughout data center 600 to illustrate the irregular experimental region data center 600 yields for Latin hypercube design.

Figure 7A:
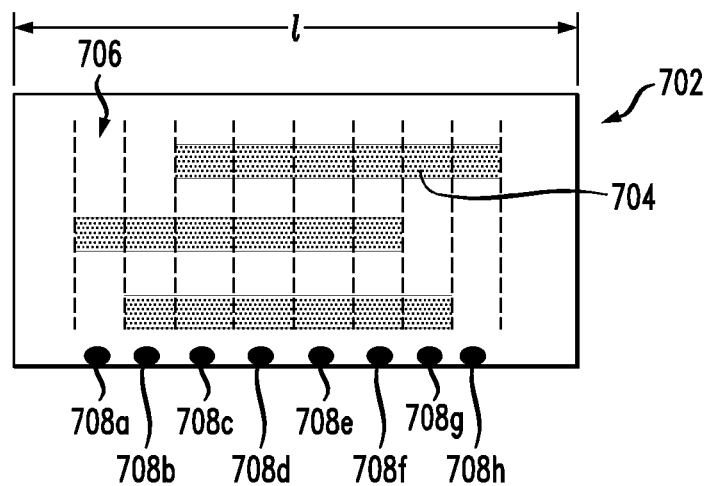
FIGS. 7A-F are diagrams illustrating use of probability-based Latin hypercube designs to determine optimum number and placement of sensors in a data center according to an embodiment of the present invention.
Figure 7B:
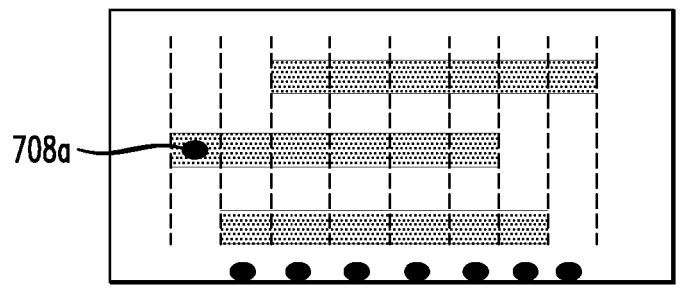
Figure 7C:
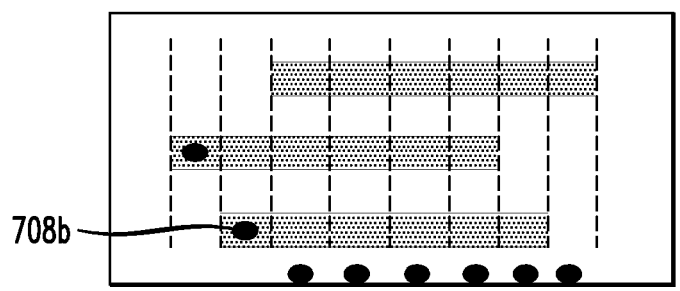
Figure 7D:
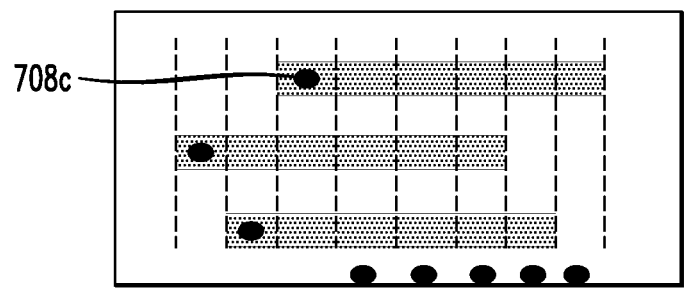
Figure 7E:
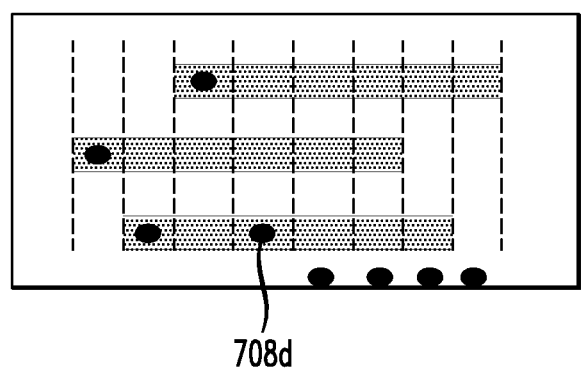

To accommodate an irregular experimental region, the present techniques employ probability-based Latin hypercube designs (see, for example, FIGS. 7A-F). FIGS. 7A-F are diagrams illustrating the use of probability-based Latin hypercube designs to determine the optimum number and placement of sensors in a data center. In FIG. 7A, a Latin hypercube grid is shown formed over irregular experimental region 702. According to an exemplary embodiment, irregular experimental region 702 is representative of a data center having rows 704 of IT equipment therein. The grid contains a number of columns 706 that intersect with rows 704. Eight real-time sensors 708a-h that are to be placed throughout the data center are shown at the bottom of FIG. 7A.

FIGS. 7B-F, detail the placement of the real-time sensors 708a-h, throughout the data center. In general, in a Latin hypercube design, an important space-filling property is one-dimensional balance, that is, projecting design points (in this case eight real-time sensors) onto any factor (in this case the y-axis). There is exactly one point for each level (column) of the factor. Thus, in this particular example, a sensor will be placed in each of the columns at a point of intersection with one of the rows. As highlighted above, a space-filling model will be used and therefore the sensors will be spread evenly throughout the data center.

Figure 7F:
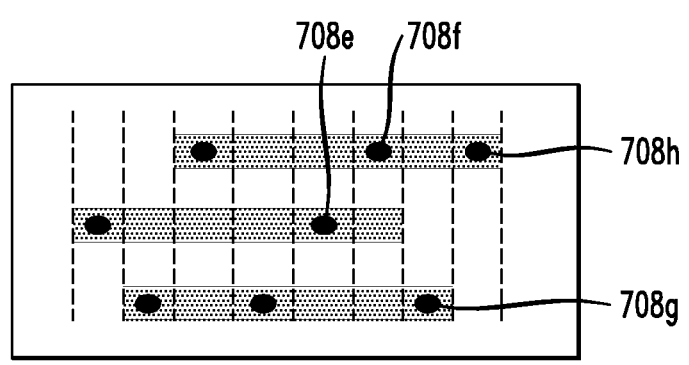

FIGS. 7B, 7C, 7D and 7E illustrate the placement of sensors 708a, 708b, 708c and 708d, respectively, according to the Latin hypercube design. FIG. 7F illustrates the placement of the remaining sensors, 708e, 708f, 708g and 708h.

Figure 8:
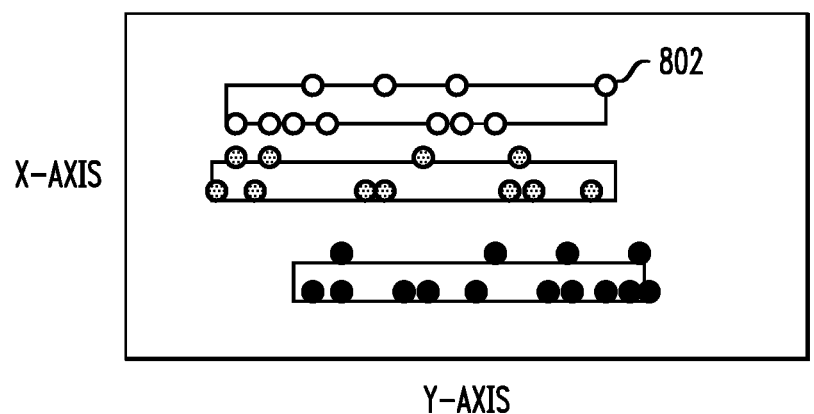
FIG. 8 is a diagram illustrating real-time sensors that have been placed in a data center using the Latin hypercube sampling methods outlined in FIGS. 7A-F according to an embodiment of the present invention.

FIG. 8 is a diagram illustrating 36 real-time sensors, i.e., real-time sensors 802, that have been placed in a data center 800 using the Latin hypercube sampling methods outlined in FIGS. 7A-F, described above. In this example, the data center also represents an irregular experimental region.

Figure 9:
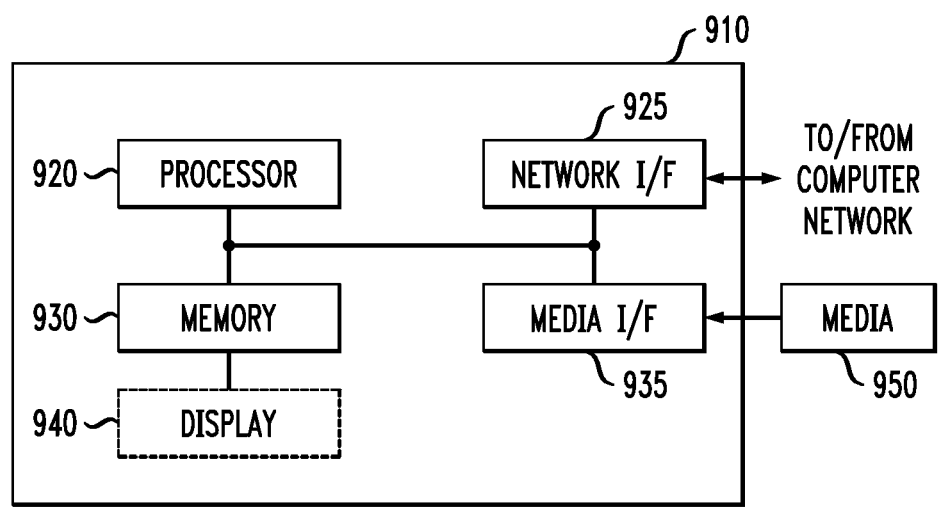
FIG. 9 is a diagram illustrating an exemplary apparatus for real-time, three-dimensional analysis of environmental operating conditions in a data center according to an embodiment of the present invention

Turning now to FIG. 9, a block diagram is shown of an apparatus 900 for real-time, three-dimensional analysis of environmental operating conditions in a data center, in accordance with one embodiment of the present invention. It should be understood that apparatus 900 represents one embodiment for implementing methodology 200 of FIG. 2.

Apparatus 900 comprises a computer system 910 and removable media 950. Computer system 910 comprises a processor 920, a network interface 925, a memory 930, a media interface 935 and an optional display 940. Network interface 925 allows computer system 910 to connect to a network, while media interface 935 allows computer system 910 to interact with media, such as a hard drive or removable media 950.

As is known in the art, the methods and apparatus discussed herein may be distributed as an article of manufacture that itself comprises a machine-readable medium containing one or more programs which when executed implement embodiments of the present invention. For instance, the machine-readable medium may contain a program configured to obtain high spatial resolution three-dimensional measurements of one or more environmental variables in the data center made at a time $t_1$; obtain real-time measurements of the environmental variables in the data center made at a time $t_2$, wherein $t_2$ is later in time than $t_1$; combine the high spatial resolution three-dimensional measurements with the real-time measurements to derive a model for the environmental variables in the data center at the time $t_2$; and use the model to predict three-dimensional distributions of the environmental variables in the data center at the time $t_2$.

The machine-readable medium may be a recordable medium (e.g., floppy disks, hard drive, optical disks such as removable media 950, or memory cards) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used.

Processor 920 can be configured to implement the methods, steps, and functions disclosed herein. The memory 930 could be distributed or local and the processor 920 could be distributed or singular. The memory 930 could be implemented as an electrical, magnetic or optical memory, or any combination of these or other types of storage devices. Moreover, the term "memory" should be construed broadly enough to encompass any information able to be read from, or written to, an address in the addressable space accessed by processor 920. With this definition, information on a network, accessible through network interface 925, is still within memory 930 because the processor 920 can retrieve the information from the network. It should be noted that each distributed processor that makes up processor 920 generally contains its own addressable memory space. It should also be noted that some or all of computer system 910 can be incorporated into an application-specific or general-use integrated circuit.

Optional video display 940 is any type of video display suitable for interacting with a human user of apparatus 900. Generally, video display 940 is a computer monitor or other similar video display.

The present techniques are further described by way of the following non-limiting examples.

EXAMPLE 1

Thermal data ($E^{MOSS}(\underline{x}^d)$) was obtained via MMT V1.0 at time $t_1$. Because MMT V1.0 provided such a dense data grid, a base model was not constructed. The real-time sensors were placed on the MMT V1.0 data grid and thus a sensor calibration was not required. New data was then gathered from the real-time sensors at a time, i.e., time $t_2$, i.e., $E^{RTSS}(\underline{x}^s,t_2)$ where no $E^{MOSS}(\underline{x}^d)$ is available (see line 3 of example code below where value and, x, y, and z coordinates are read from the sensors). The $E^{RTSS}(\underline{x}^s,t_2)$ was then compared with the initial $E^{MOSS}(\underline{x}^d)$ (at time $t_1$) results at $\underline{x}^s$ (see line 12 of example code below, where the initial values (room.GTemp) are compared with the latest readings (at time $t_2$) (value)). The difference between $E^{RTSS}(\underline{x}^s,t_2)$ and $E^{MOSS}(\underline{x}^d)$ was then modeled using a griding function (see line 15 of example code below). The model was then used to predict a complete temperature field at time $t_2$ (see line 19 of example code below, where a new three-dimensional temperature distribution is calculated). Whenever there was new real-time data, for example, at time $t_x$, i.e., $E^{RTSS}(\underline{x}^s,t_x)$, available the above-described steps were repeated (i.e., called function mmt_fillNewThermalData).

```
1  FUNCTION mmt_fillNewThermalData, room, sensorNewTempCsv,
   outSensors
2      sid = "
3      res = DC_READ_FREE(sensorNewTempCsv,
       /Column, Resize=[1,2,3,4,5], sid, value, x, y, z)
4      sz = N_ELEMENTS(sid)
5      outSensors = REPLICATE({STRUC1, ID:", T:0.0,
       X:0, Y:0, Z:0}, sz)
6      sens = FLTARR(4, sz)
7
8      FOR i = 0, sz – 1 DO BEGIN
9          sens(0, i) = x(i)
10         sens(1, i) = y(i)
11         sens(2, i) = z(i)
12         sens(3, i) = room.GTemp(x(i), y(i), z(i)) – value(i)
13         outSensors(i) = {STRUC1, sid(i), value(i), x(i), y(i), z(i)}
14     END
15     corr3D = GRID_4D(sens, room.DX, room.DY, room.DZ)
16
17     mint = MIN(room.GTemp)
18     index = WHERE(room.GTemp EQ mint, count)
19     newT3D = room.GTemp(*, *, *) + corr3D(*, *, *)
20
21     mint = MIN(newT3D)
22     IF count GT 0 THEN newT3D(index) = mint
23     RETURN, newT3D
24 END
```

EXAMPLE 2

$E^{MOSS}(\underline{x}^d)$ was obtained using temperature results from CFD calculations. Because these calculations are too slow to be repeated in real-time, the data was represented and modeled by a simple model, such as the Laplacian model approach as described in U.S. application Ser. No. 12/146,852 or a simple provisioning model (create $M(\underline{\tilde{x}}(t_1))$). In the example using a Laplacian model approach, the complete data center was described by the physical dimensions and locations of its infrastructure and equipment, as well as by the power levels and the different air flow boundaries (and/or temperature boundaries) (see U.S. application Ser. No. 12/146,852 for a detailed discussion). Because the real-time sensors were not on the same grid as the CFD model results (compare with Example 1, described above), the real-time sensor data and the CFD model results had to be referenced to each other. In this example, the real-time data at time $t_1$ $E^{RTSS}(\underline{x}^s,t_1)$ was compared with the MOSS data $E^{MOSS}(\underline{x}^d)$ to obtain an updated base model $M(\underline{\tilde{x}}(t_1))$, which took the differences between RTSS and MOSS sensors into account. Updated real-time data was then obtained at time $t_2$, i.e., $E^{RTSS}(\underline{x}^s{}_2)$. Some additional real-time data was obtained, such as PDU power consumption. The PDU power consumption can be related to the power consumption of each IT equipment component (as highlighted above). An updated set of input parameters for the model was obtained, i.e., $(\underline{\tilde{x}}t_2)$.

Real-time sensor readings at time $t_3$, i.e., $E^{RTSS}(\underline{x}, t_3)$, were then compared with the initial MOSS data (from time $t_1$). A new model was then constructed with the updated parameters. For example, the updated model contained the real-time measurements of some of the input parameters at time $t_3$. The updated model was then used to predict the dense distribution of the environmental variable.

EXAMPLE 3

Figure 10:
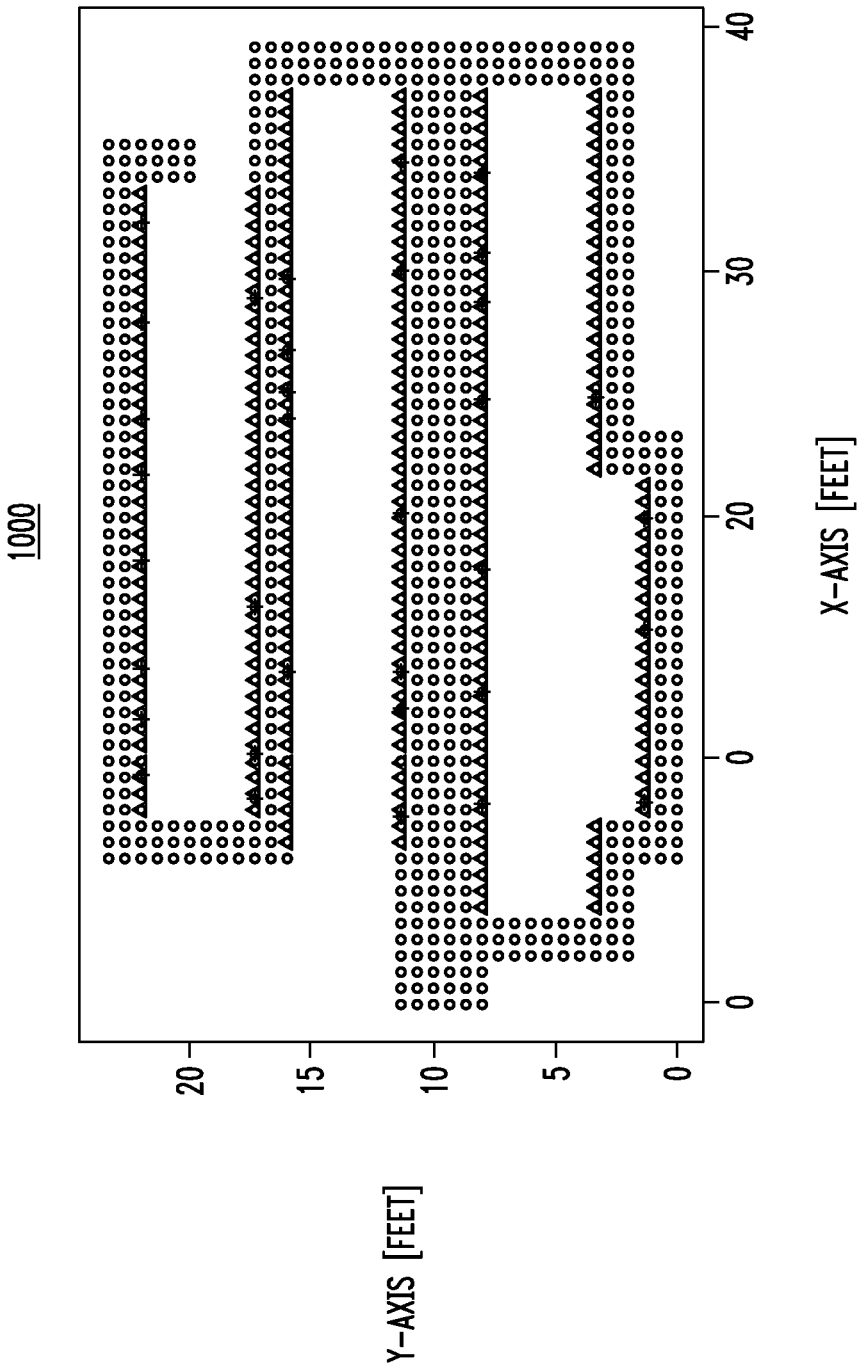
FIG. 10 is a graph illustrating mobile measurement technology (MMT) measurements obtained from a sample data center according to an embodiment of the present invention.
Figure 11:
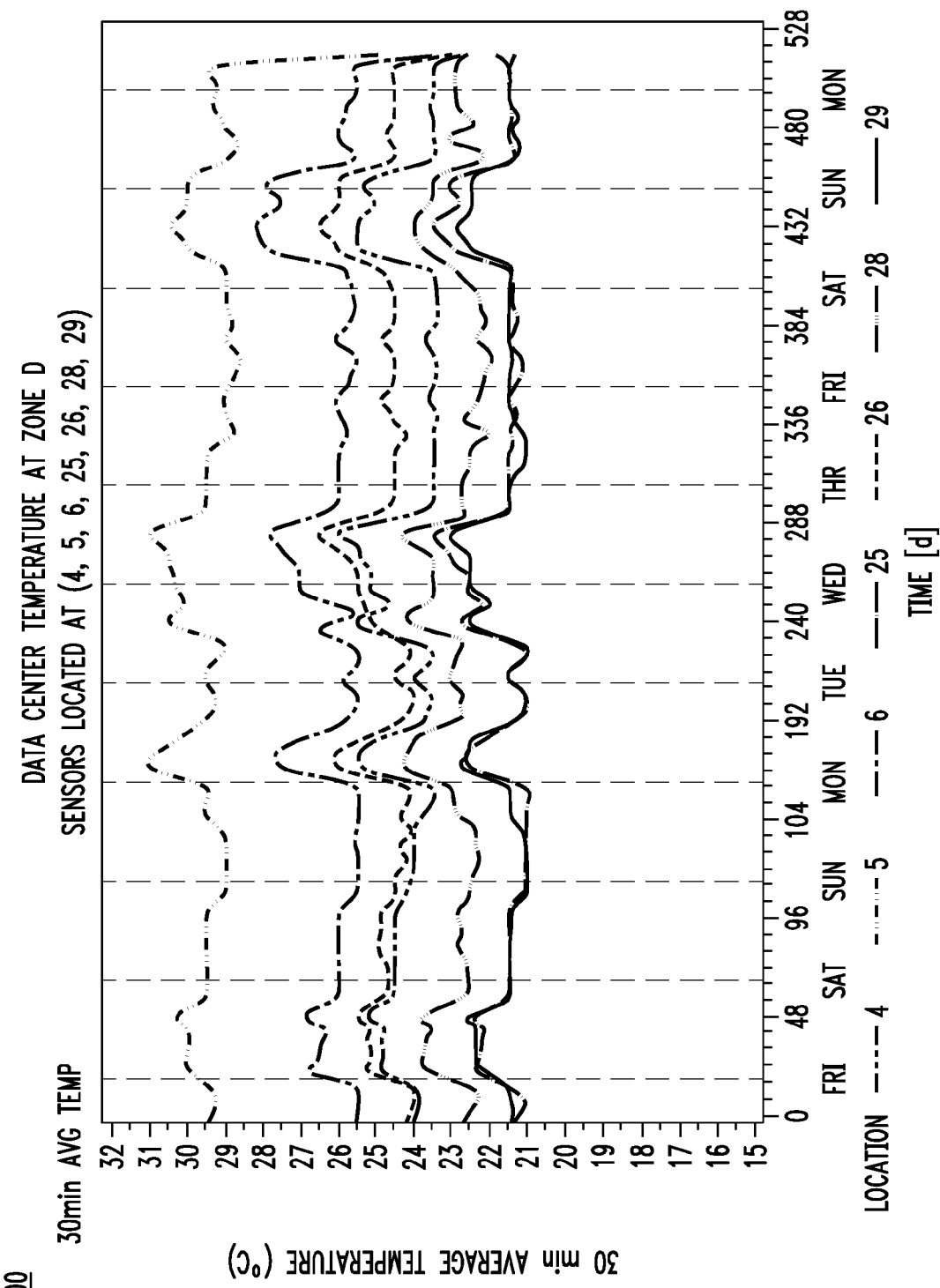
FIG. 11 is a graph illustrating real-time sensor observations from the sample data center plotted as a function of observation time according to an embodiment of the present invention.

To demonstrate the effectiveness of the present real-time, three-dimensional analysis techniques, both MMT measurements (FIG. 10) and real-time sensor measurements (FIG. 11) were obtained for a sample data center. FIG. 10 is graph 1000 illustrating MMT measurements obtained from the sample data center, wherein circles (○) are the MMT measurements, triangles (Δ) indicate server inlets and outlets and plus symbols (+) indicate sensors. Both the x-axis and the y-axis represent the data center dimensions measured in feet. As described above and as exemplified from graph 1000, the MMT V1.0 measurement data has high spatial resolution. As also described above, however, the MMT measurement data is temporally sparse, since for any given data center such measurements are typically performed only once or twice a year. FIG. 11 is graph 1100 illustrating real-time sensor observations, i.e., measurements from the sample data center, with 30-minute average temperature (measured in ° C.) plotted as a function of observation time (measured in terms of days (d)). As can be seen from graph 1100, data is provided from only seven locations throughout the data center. Therefore, as described above, the real-time sensors provide data with low spatial resolution. The objectives of this example were to 1) fit a statistical model (described above) to incorporate time, space, as well as other various factors X, such as open area of the perforated floor tile and distance to ACUs, and 2) predict a future temperature distribution over the data center area.

To predict a future temperature distribution, the MMT measurements, for reasons of simplicity called $y^{MMT}$ instead of $E^{MOSS}(\underline{x}^d)$ and the real-time sensor observations $y^S$ are related to each other according to the following steps:

$y^S = f(X, t) + \epsilon(X, t), t \in [0, T]$,  Step 1:

$y_{t_F}^{MMT} = \hat{\beta}_0(X) + \hat{\beta}_1 \hat{y}_{t_F}^S, t_F \in 0, T$,  Step 2:

wherein $f(X,t)$ is some function depending on factors X and time t, $t \in [0,T]$ and $t_0 \in [0,T]$ represent time instances t and $t_0$, respectively, with T being a time interval over which real-time sensor data are available, $\epsilon(X, t)$ is a Gaussian process with mean zero and covariance function $\sigma^2 \psi$, with a Gaussian correlation function applied to $\psi$. The quantity $\hat{y}_{t_0}^S$ is an estimate of the real-time temperature at some time $t_0 \in [0,T]$ where the MMT measurements are available and both $\beta_0$ and $\beta_1$ are initially unknown coefficients. Similarly, an estimate (prediction) of the temperature at a future time $t_F > T$ (i.e., real-time sensor data may not always be available exactly at time $t_F > T$, therefore one has to predict the temperature based on the existing model for time $t_F > T$) is given by the following expression:

$\hat{y}_{t_F}^{MMT} = \hat{\beta}_0(X) + \hat{\beta}_1 \hat{y}_{t_F}^S, t_F > T$,  Step 3:

wherein $\hat{\beta}_0$ and $\hat{\beta}_1$ are estimates of initially unknown coefficients $\beta_0$ and $\beta_1$, respectively.

Figure 12:
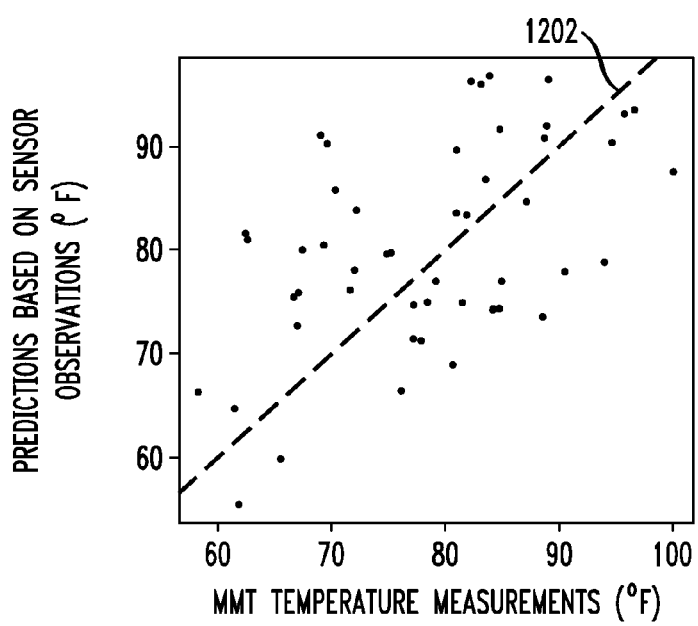
FIG. 12 is a graph illustrating a comparison between predicted temperature values based on real-time sensor observations and direct MMT temperature measurements according to an embodiment of the present invention.

FIG. 12 is graph 1200 illustrating a comparison between predicted temperature values based on real-time sensor observations (y-axis) and direct MMT temperature measurements (x-axis), both expressed in terms of degrees Fahrenheit (° F.). The predicted temperature values based on real-time sensor data are obtained by using real-time data to update the data center model and then using the updated model to make temperature predictions. Note that in an ideal situation, the predicted values should lay on dashed line 1202.

As highlighted above, other factors X can be incorporated in the analysis. By way of example only, the following factors X were used:

$X_1$: x-axis, $X_2$: y-axis, $X_3$: z-axis (height)

$X_4$: air inlet or outlet of server racks, $X_5$: distance to ACU $X_6$: open tile area.

wherein factors $X_1$, $X_2$ and $X_3$ represent three-dimensional coordinates of a location where the temperature is to be estimated (predicted), factor $X_4$ indicates whether a front (cool air inlet) or a back (hot air outlet) of a server rack is positioned at distance $X_5$ from the ACU assigned to a zone in which the server rack resides. Factor $X_6$ represents a size of the open floor tile area in front of the server rack. In this instant example, specific MMT temperature measurements $y^{MMT}$ and real-time sensor observations $y^S$ were modeled (in units of ° F.) as follows:

$y^S = 78.05 + 7.81 x_{3f} - 3.99 x_{3f} x_{5q} + f(t) + \epsilon(X, t), t \in [0, 1000]$, $y_{500}^{MMT} = 55.41 - 5.5 x_{1f} - 2.2 x_{4f} + 0.28 \hat{y}_{500}^S$, An estimate (prediction) of the temperature at a future time $t_F = 1050$ is given by the following expression:

$\hat{y}_{1050}^{MMT} = 55.41 - 5.5 x_{1f} - 2.2 x_{4f} + 0.28 \hat{y}_{1050}^S$.

Figure 13:
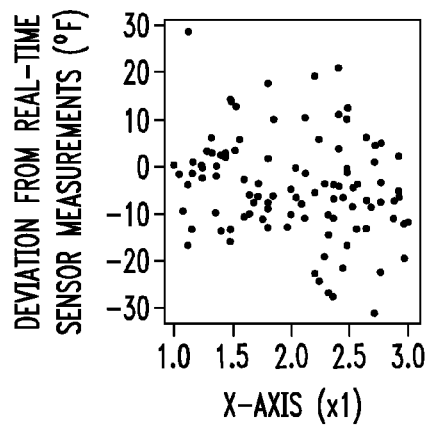
FIG. 13 is a graph illustrating a deviation between model-predicted temperature values and actual real-time sensor measurements as a function of an x-axis factor according to an embodiment of the present invention.
Figure 14:
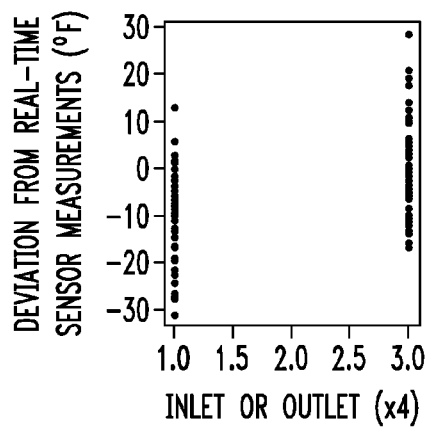
FIG. 14 is a graph illustrating a deviation between model-predicted temperature values and actual real-time sensor measurements as a function of an inlet or outlet factor according to an embodiment of the present invention.

FIG. 13 is graph 1300 illustrating a deviation between model-predicted temperature values and actual real-time sensor measurements (measured in ° F.) as a function of the factor $X_1$ (x-axis), wherein factor $X_1$ is normalized to fit the range [1.0, 3.03.] FIG. 14 is graph 1400 illustrating a deviation between model-predicted temperature values and actual real-time sensor measurements (measured in ° F.) as a function of the inlet or outlet factor $X_4$, wherein level 1.0 represents outlet and level 3.0 represents inlet.

Kriging Models

As indicated above, the following description of a "Kriging model" is considered part of an exemplary embodiment of a modeling (prediction) scheme for three-dimensional thermal distributions, according to the present techniques. Well-known extrapolation/interpolation methodologies, such as linear, cubic spline or Kriging, may be applied to data center areas not accessible during an MMT survey. While MMT measurements provide high spatial resolution (see above), they are typically temporally sparse, e.g., performed once or twice a year for a given data center. Thus, data obtained from real-time sensors are compared to corresponding data generated by the three-dimensional thermal distribution model that was originally derived from MMT measurements. Based on the differences found (i.e., difference between what the base model predicts and the "dynamic" model predicts) that may have occurred over time, the models derived from high resolution MMT measurements can be adjusted if necessary, as dictated by the chosen MSE criterion. One approach to accomplish this is to use Kriging techniques as described below. Here the term "Kriging" stands for a kind of interpolation method to predict unknown values from data points measured at known locations (see above).

A universal Kriging model can be stated as follows. Assume that the true function $y(x), x \in R^P$, is a realization from a stochastic process:

$Y(x) = \mu(x) + Z(x)$, wherein $\mu(x)=\Sigma_{i=0}^{m}\mu_i v_i(x)$ and $Z(x)$ is a weak stationary stochastic process with mean zero and covariance function $\sigma^2\psi$, having $v_i$ represent known functions and $\mu_i$ represent unknown parameters. The covariance function is defined as $\text{cov}\{Y(x+h),Y(x)\}=\sigma^2\psi(h)$, where the correlation function $\psi((h)$ is a positive semidefinite function with $\psi(0)=1$ and $\psi(-h)=\psi(h)$. But, in practice, an ordinary Kriging model is commonly used. Ordinary Kriging includes, for example, spherical, circular exponential and linear methods, and assumes that the variation in z-values is free of any structural component (drift), while universal Kriging assumes that the spatial variation in z-values is the sum of three components: a structural component (drift), a random spatially correlated component and random noise representing residual errors. Ordinary Kriging is analytically defined by the following expression:

$$Y(x)=\mu_0+Z(x),$$

wherein $\mu_0$ is an unknown parameter.

There are, however, problems associated with these universal/ordinary Kriging models. Namely, the predication can be poor if there are some strong trends. See, for example, J. D. Martin, et al., "Use of Kriging Models to Approximate Deterministic Computer Models," *AIAA Journal*, vol. 43, no. 4, pp. 853-863 (April 2005), the contents of which are incorporated by reference herein. Also, it is not easy to understand the effects of parameters and factors of these Kriging models just by looking at the predictor. Further, the predictor is not robust to possible misspecifications in the correlation parameters. Therefore, according to the present techniques, a blind Kriging model is used as the preferred method to circumvent these problems. See, for example, V. R. Joseph et al., "Blind Kriging: A New Method for Developing Metamodels," *ASME Journal of Mechanical Design*, vol. 130, 031102 (March 2008) (hereinafter "Joseph 2008"), the contents of which are incorporated by reference herein.

The blind Kriging model is analytically defined by the following expression:

$$Y(x)=v(x)'\mu+Z(x),$$

wherein $v(x)'=(1,v_1(x),\ldots,v_m(x))$, $\mu=(\mu_0,\mu_1,\ldots,\mu_m)$ and m are unknown. The $v_i(x)$ terms of the functions are not assumed to be known. Instead, the $v_i(x)$ terms are identified through some data-analytic procedure. Because the $v_i(x)$ terms are unknown in this model, it is called "blind Kriging."

The blind Kriging predictor is analytically defined by the following expression:

$$\hat{y}(x)=v(x)'\hat{\mu}_m+\psi(x)'\Psi^{-1}(y-V_m\hat{\mu}_m),$$

wherein $V_m=(v(x_1),\ldots,v(x_n))'$ and $\hat{\mu}_m=(V'_m\Psi^{-1}V_m)^{-1}V'_m\Psi^{-1}y$. Note that the blind Kriging predictor has the same form as that of the universal Kriging predictor. An important step in blind Kriging is to identify the unknown $v_i(x)$ terms of the functions, which can be chosen from a set of candidate functions (or variables) using variable selection techniques. A variable selection technique related to the Kriging methodology is described, for example, in V. R. Joseph, "A Bayesian Approach to the Design and Analysis of Fractionated Experiments," *Technometrics*, vol. 48, no. 2, pp. 219-229 (2006) and in V. R. Joseph, et al., "Functionally Induced Priors for the Analysis of Experiments," *Technometrics*, vol. 49, no. 1, pp. 1-11 (2007), the contents of each of which are incorporated by reference herein, and can be considered a Bayesian version of the forward selection strategy. The simplest data-driven model building approach is called "forward selection." In this approach, one adds variables to the model one at a time. At each step, each variable that is not already in the model is tested for inclusion in the model and the most significant of these variables is added to the model. The variable selection technique is described below. Additional details of this technique and examples can be found in Joseph 2008.

With the variable selection technique, denote the candidate variables by $u_1,\ldots,u_t$. Consider approximating $y(x)$ by $\Sigma_{i=0}^{m}\mu_i v_i+\Sigma_{i=0}^{t}\beta_i u_i$, where $\mu_0=1$. With prior distributions $\beta\sim N(0,\tau_m^2 R)$, a posterior can be calculated by, $$\hat{\beta}=\frac{\tau_m^2}{\sigma_m^2}RU'\Psi^{-1}(y-V_m\hat{\mu}_m).$$

A variable can be declared important if an absolute coefficient $\hat{\beta}_i$ of that variable is large. Thus, the variable to enter at each step $m=1,2,\ldots$ can be selected as the variable with the largest $|\hat{\beta}_i|$. To help determine what is a best value of m, a cross validation prediction error (CVPE) is first defined as:

$$CVPE(m)=\sqrt{\frac{1}{n}\sum_{i=1}^{n}cv_i^2},$$

wherein $cv_i=y_i-\hat{y}_{(i)}(x_i)$ is leave-out-one cross validation error. One can choose the value of m that minimizes CVPE(m).

In the estimation procedure, the following Gaussian product correlation function is used:

$$\psi(h)=\exp\left(-\sum_{j=1}^{p}\theta_j h_j^2\right),$$

with $\theta=(\theta_1,\ldots,\theta_p)'$. The parameters $\theta$, $\mu_m$, and $\sigma_m^2$ can be estimated by maximizing the likelihood. Thus, $$\hat{\theta}=\operatorname*{argmin}_{\theta} n\log\hat{\sigma}_0^2+\log|\Psi|,$$

wherein $\hat{\mu}_m=(V'_m\Psi^{-1}V_m)^{-1}V'_m\Psi^{-1}y$, and $$\hat{\sigma}_m^2=\frac{1}{n}(y-V_m\hat{\mu}_m)'\Psi^{-1}(y-V_m\hat{\mu}_m).$$

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for real-time, three-dimensional analysis of environmental operating conditions in a data center comprising the steps of:

obtaining three-dimensional measurements of one or more environmental variables in the data center made, at a time $t_1$, using a mobile off-line surveying system which provides a snap-shot of the environmental variables in the data center at the time $t_1$;

obtaining real-time measurements of the environmental variables in the data center made, at a time $t_2$, wherein $t_2$ is later than $t_1$, using a real-time sensing system that employs real-time sensors placed throughout the data center that continuously monitor the environmental operating conditions in real-time;

combining the three-dimensional measurements with the real-time measurements to derive a model for the environmental variables in the data center at the time $t_2$; and using the model to predict three-dimensional distributions of the environmental variables in the data center at the time $t_2$ with spatial resolution greater than a spatial resolution of the real-time sensors.

2. The method of claim 1, wherein the environmental variables comprise one or more of thermal conditions, ambient temperatures, thermal distributions, humidity, air flow, pressures, power distributions and current consumption.

3. The method of claim 1, wherein the mobile off-line surveying system is mobile measurement technology.

4. The method of claim 1, wherein the three-dimensional measurements are made with a three-dimensional spatial resolution of less than one cubic foot.

5. The method of claim 1, further comprising the steps of:
using the three-dimensional measurements to create a base model; and
combining the base model with the real-time measurements to derive the model for the environmental variables in the data center at the time $t_2$.

6. The method of claim 5, wherein the base model comprises one or more of a direct measurement model, a statistical model and a physics-based model.

7. The method of claim 5, wherein the base model comprises one or more of a Kriging/interpolation model, a reduced order model and a proper orthogonal decomposition model.

8. The method of claim 5, wherein the base model comprises one or more of a zoning/provisioning model and a simplified heat convection/conduction model.

9. The method of claim 5, further comprising the steps of:
obtaining real-time measurements of the one or more environmental variables in the data center made at time $t_1$; and
creating an altered base model that includes both the three-dimensional measurements and the real-time measurements.

10. The method of claim 1, wherein the three-dimensional measurements are combined with the real-time measurements using sensor data fusion.

11. The method of claim 1, further comprising the steps of:
obtaining real-time measurements of the environmental variables in the data center made at a time $t_x$, wherein $t_x$ is later in time than $t_1$ and $t_2$;
determining whether or not to update the model based on a comparison between the real-time measurements of the environmental variables in the data center at the time $t_x$ and the model;
if the model is to be updated, deriving a set of update parameters for the model; and
using the updated model to predict three-dimensional distributions of the environmental variables in the data center at the time $t_x$.

12. An apparatus for real-time, three-dimensional analysis of environmental operating conditions in a data center, the apparatus comprising:
a memory; and
at least one processor, coupled to the memory, operative to:
obtain three-dimensional measurements of one or more environmental variables in the data center made, at a time $t_1$, using a mobile off-line surveying system which provides a snap-shot of the environmental variables in the data center at the time $t_1$;
obtain real-time measurements of the environmental variables in the data center made, at a time $t_2$ wherein $t_2$ is later in time than $t_1$, using a real-time sensing system that employs real-time sensors placed throughout the data center that continuously monitor the environmental operating conditions in real-time;
combine the three-dimensional measurements with the real-time measurements to derive a model for the environmental variables in the data center at the time $t_2$; and
use the model to predict three-dimensional distributions of the environmental variables in the data center at the time $t_2$ with a spatial resolution greater than a spatial resolution of the real-time sensors.

13. The apparatus of claim 12, wherein the at least one processor is further operative to:
use the three-dimensional measurements to create a base model; and
combine the base model with the real-time measurements to derive the model for the environmental variables in the data center at the time $t_2$.

14. An article of manufacture for real-time, three-dimensional analysis of environmental operating conditions in a data center, comprising a machine-readable recordable non-transitory medium containing one or more programs which when executed implement the steps of:
obtaining three-dimensional measurements of one or more environmental variables in the data center made, at a time $t_1$, using a mobile off-line surveying system which provides a snap-shot of the environmental variables in the data center at the time $t_1$;
obtaining real-time measurements of the environmental variables in the data center made, at a time $t_2$, wherein $t_2$ is later than $t_1$, using a real-time sensing system that employs real-time sensors placed throughout the data center that continuously monitor the environmental operating conditions in real-time;
combining the three-dimensional measurements with the real-time measurements to derive a model for the environmental variables in the data center at the time $t_2$; and
using the model to predict three-dimensional distributions of the environmental variables in the data center at the time $t_2$ with spatial resolution greater than a spatial resolution of the real-time sensors.

15. The article of manufacture of claim 14, wherein the one or more programs which when executed further implement the steps of:
using the three-dimensional measurements to create a base model; and
combining the base model with the real-time measurements to derive the model for the environmental variables in the data center at the time $t_2$.

16. A system for real-time, three-dimensional analysis of environmental operating conditions in a data center comprising:
a mobile off-line surveying system having a plurality of mobile off-line sensors configured to make three-dimensional measurements of one or more environmental variables in the data center providing a snap-shot of the environmental variables in the data center;
a real-time sensing system having a plurality of real-time sensors placed throughout the data center that continuously monitor the environmental operating conditions in real-time and are configured to make real-time measurements of the environmental variables in the data center;
a first functional module configured to take the high spatial resolution three-Dimensional measurements from the mobile off-line surveying system and derive a base model at a time $t_1$ for the environmental variables in the data center;

a second functional module configured to combine the base model with real-time measurements from the real-time sensing system at a given time $t_x$ to derive a data center model which can be used to predict three-dimensional distributions of the environmental variables in the data center at the time $t_x$, wherein $t_x$ is later in time than $t_1$, with a spatial resolution greater than a spatial resolution of the real-time sensors;

a third functional module configured to monitor and compare data output from the data center model and the real-time sensing system; and a fourth functional module configured to derive a set of update parameters for the data center model.

17. The system of claim 16, wherein one or more of the real-time sensors are wireless.

18. The system of claim 16, wherein one or more of the mobile off-line sensors are wireless.

19. The system of claim 16, wherein the mobile off-line surveying system is mobile measurement technology.

20. The system of claim 16, wherein the real-time sensors are placed throughout the data center based on (Latin) hypercube sampling.

21. The system of claim 16, wherein the fourth functional module is configured to derive a set of update parameters for the data center model due to an occurrence of one or more changes to the data center.

22. The system of claim 16, wherein each of the functional modules has an interface that enables communication with one or more of the other functional modules, the mobile off-line surveying system and the real-time sensing system by means of a messaging protocol based on a publish-subscribe principle.

23. The system of claim 22, wherein the messaging protocol is message queue telemetry transport protocol.

* * * * *